(12) United States Patent
Hayashi et al.

(10) Patent No.: US 12,463,159 B2
(45) Date of Patent: Nov. 4, 2025

(54) MODULE

(71) Applicant: Murata Manufacturing Co., Ltd., Nagaokakyo (JP)

(72) Inventors: Shota Hayashi, Nagaokakyo (JP); Nobuaki Ogawa, Nagaokakyo (JP); Yuki Asano, Nagaokakyo (JP); Takanori Uejima, Nagaokakyo (JP); Hiromichi Kitajima, Nagaokakyo (JP); Takahiro Eguchi, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 415 days.

(21) Appl. No.: 18/166,563

(22) Filed: Feb. 9, 2023

(65) Prior Publication Data

US 2023/0187388 A1 Jun. 15, 2023

Related U.S. Application Data

(63) Continuation of application No. PCT/JP2021/027642, filed on Jul. 27, 2021.

(30) Foreign Application Priority Data

Aug. 13, 2020 (JP) .................................. 2020-136644
Jan. 15, 2021 (JP) .................................. 2021-005119

(51) Int. Cl.
*H01L 23/552* (2006.01)
*H01L 23/66* (2006.01)
*H01L 25/16* (2023.01)

(52) U.S. Cl.
CPC ...... *H01L 23/66* (2013.01); *H01L 2223/6661* (2013.01)

(58) Field of Classification Search
CPC .... H05K 9/0024; H05K 9/0037; H01L 23/66; H01L 23/3121; H01L 23/552; H01L 25/16

See application file for complete search history.

(56) References Cited

U.S. PATENT DOCUMENTS 9,070,793 B2  6/2015  Liao et al.
2006/0258050 A1  11/2006  Fujiwara et al.
(Continued)

FOREIGN PATENT DOCUMENTS

JP  2005-317935 A  11/2005
JP  2007-294965 A  11/2007
(Continued)

OTHER PUBLICATIONS

International Search Report for PCT/JP2021/027642 dated Oct. 12, 2021.

*Primary Examiner* — Omar F Mojaddedi
(74) *Attorney, Agent, or Firm* — McDonald Hopkins LLC

(57) ABSTRACT

A substrate has an upper main surface and a lower main surface arranged in an up-down direction. The metal member is provided on the upper main surface of the substrate. The metal member includes a plate-shaped portion and one or more foot portions. The plate-shaped portion has a front main surface and a back main surface arranged in a front-back direction when viewed in the up-down direction. The one or more foot portions extend backward from the lower side by bending the metal member at the lower side of the plate-shaped portion. A line extending in a predetermined direction is provided on the front main surface, the back main surface, the outer surface of the portion where the metal member is bent, and the inner surface of the portion where the metal member is bent.

11 Claims, 34 Drawing Sheets

(56) References Cited

U.S. PATENT DOCUMENTS

| | | |
|---|---|---|
| 2007/0246825 A1 | 10/2007 | Oh et al. |
| 2012/0025356 A1* | 2/2012 | Liao ................. H01L 23/49805 |
| | | 257/659 |
| 2012/0320559 A1* | 12/2012 | Kimura ................ H01L 23/552 |
| | | 361/818 |
| 2013/0271928 A1 | 10/2013 | Shimamura et al. |
| 2016/0284632 A1* | 9/2016 | Shinohara ......... H01L 23/49555 |
| 2017/0354039 A1 | 12/2017 | Miwa |
| 2020/0323077 A1* | 10/2020 | Han ..................... H05K 3/4007 |
| 2022/0007499 A1 | 1/2022 | Okamoto et al. |

FOREIGN PATENT DOCUMENTS

| | | |
|---|---|---|
| JP | 2011-187677 A | 9/2011 |
| JP | 2013-222829 A | 10/2013 |
| WO | 2016/092893 A1 | 6/2016 |
| WO | 2020/202841 A1 | 10/2020 |

* cited by examiner

Fig. 1
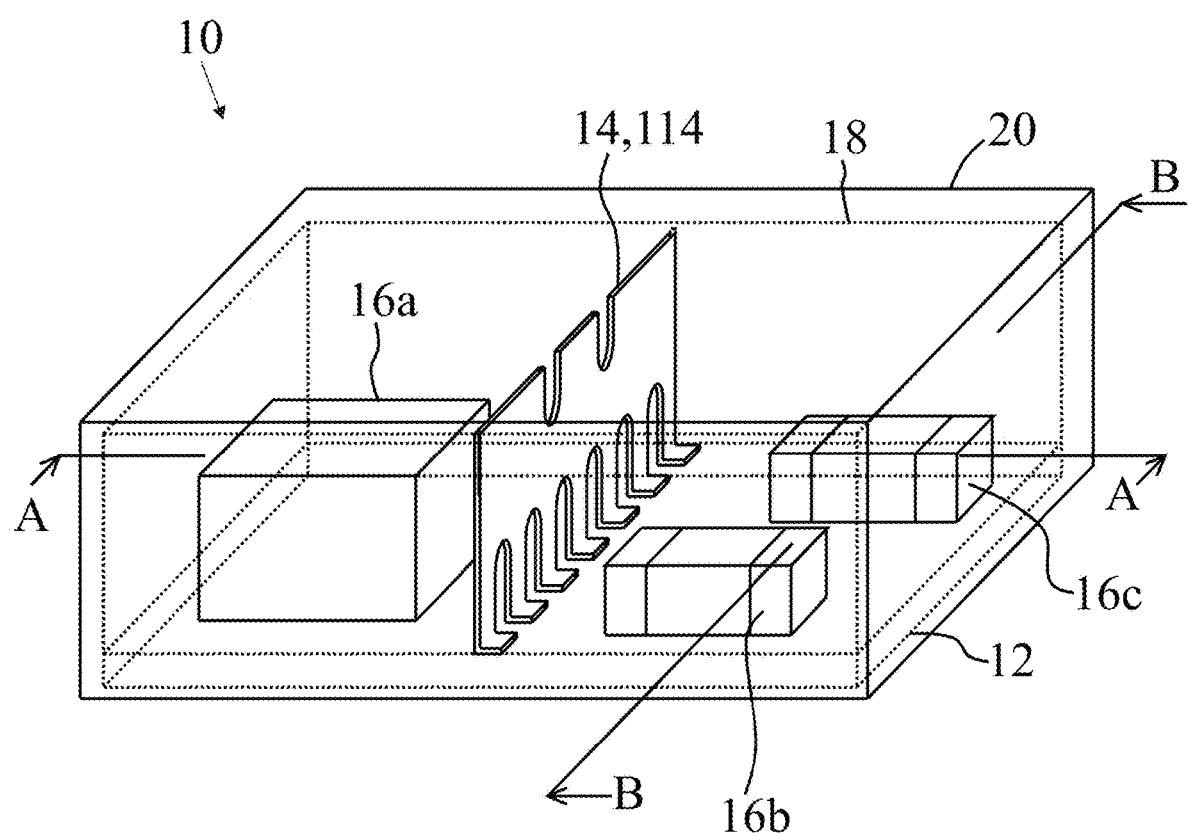
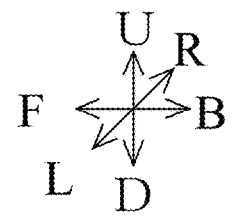

Fig. 3
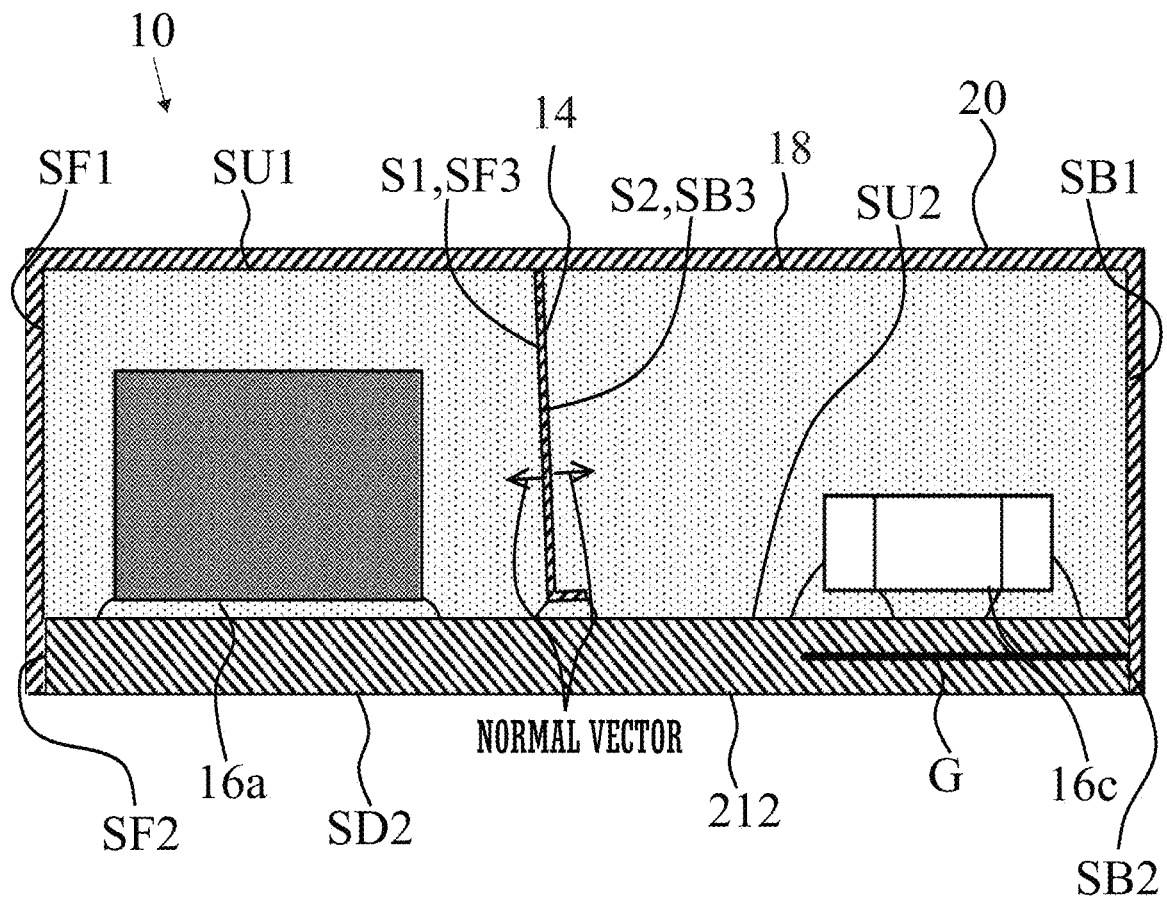
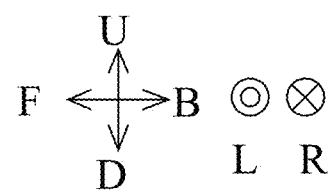

Fig.12
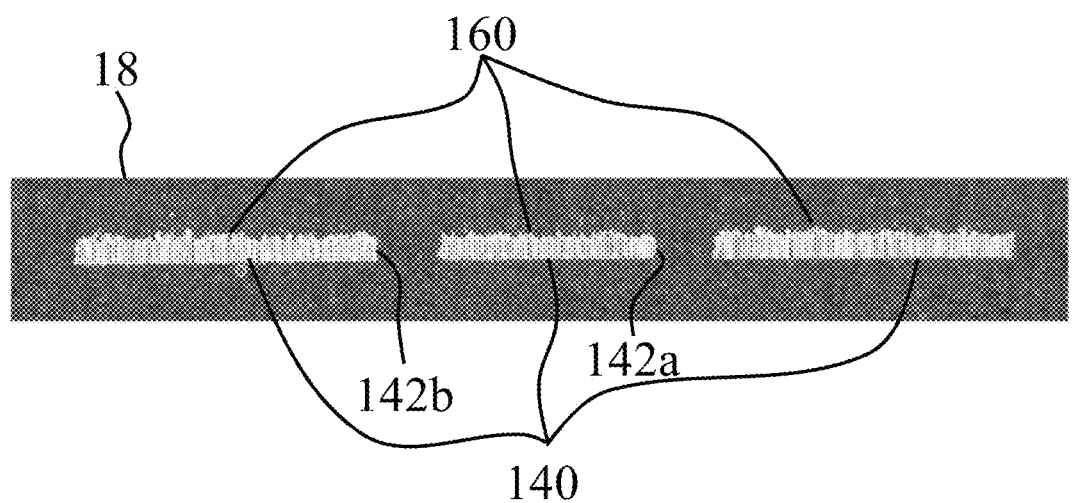
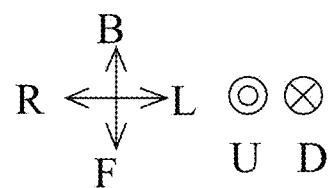

Fig. 13
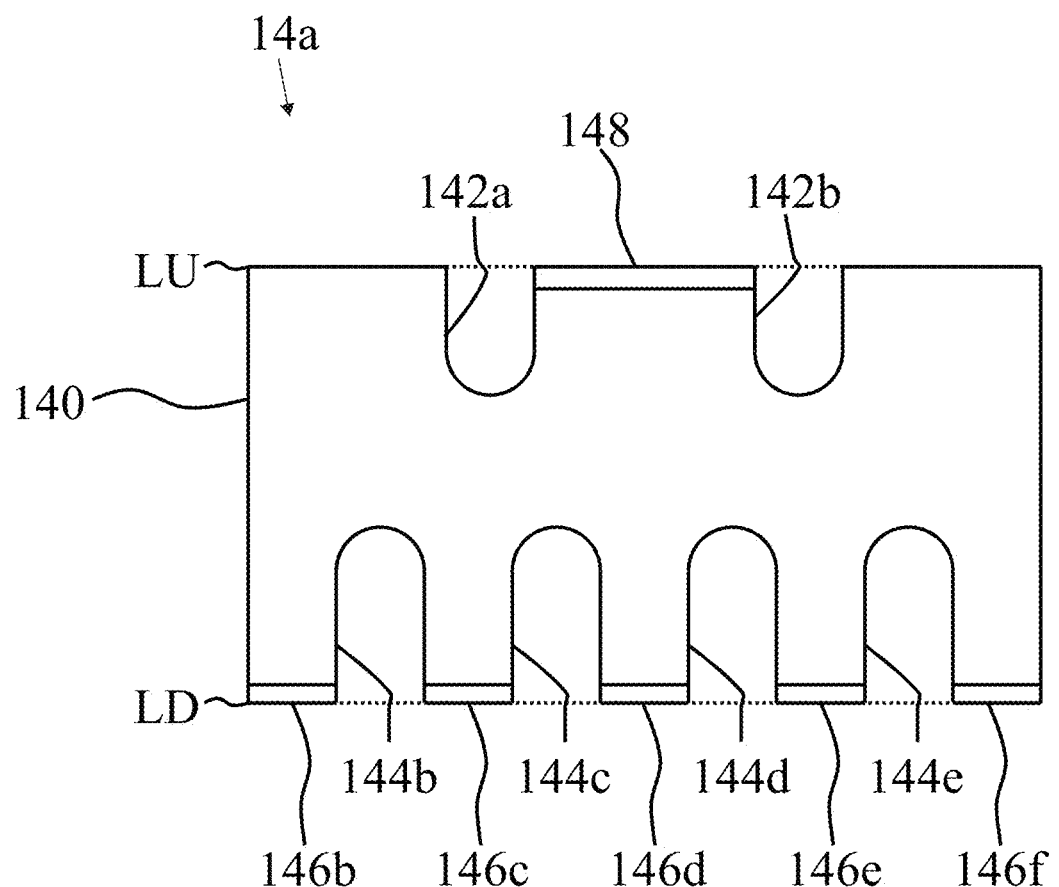
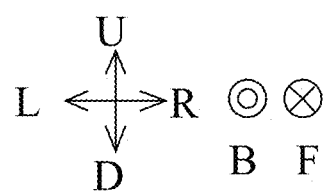

Fig. 14
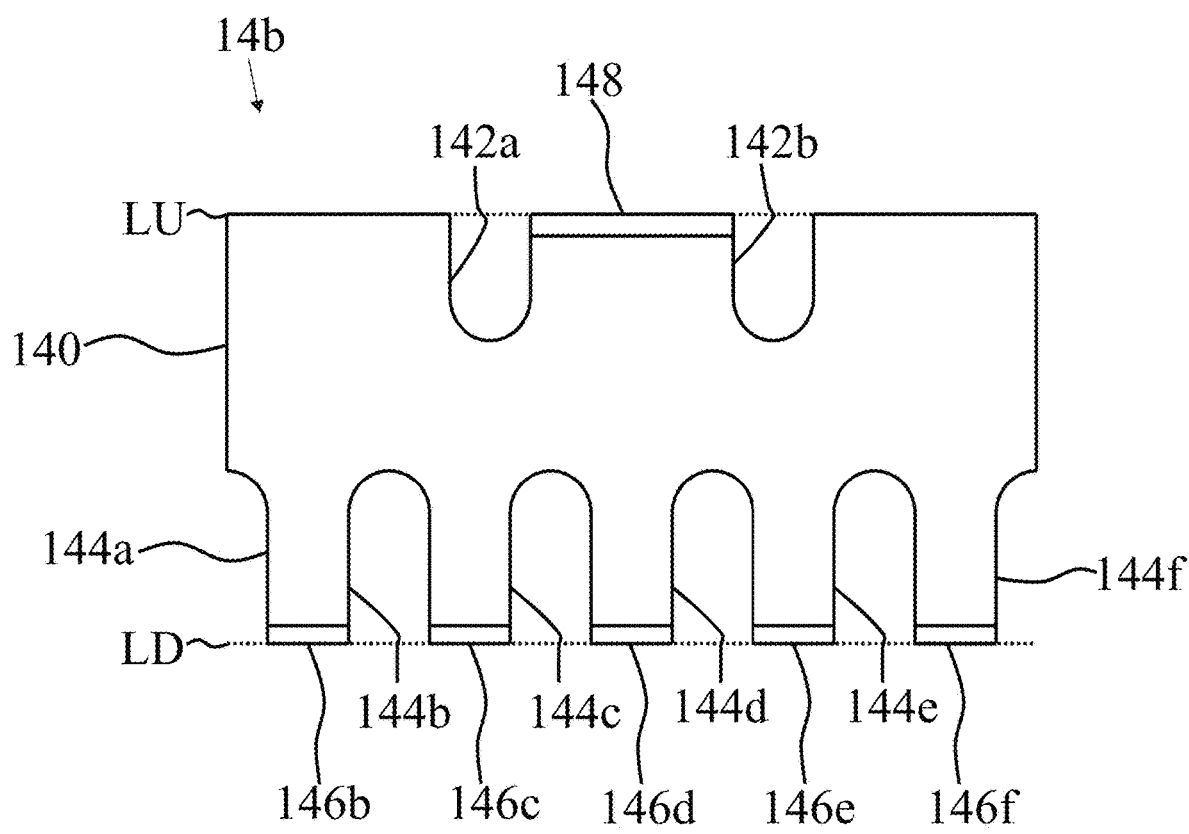
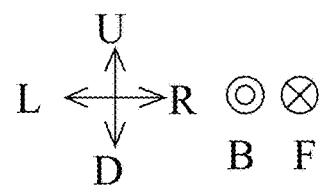

Fig. 16
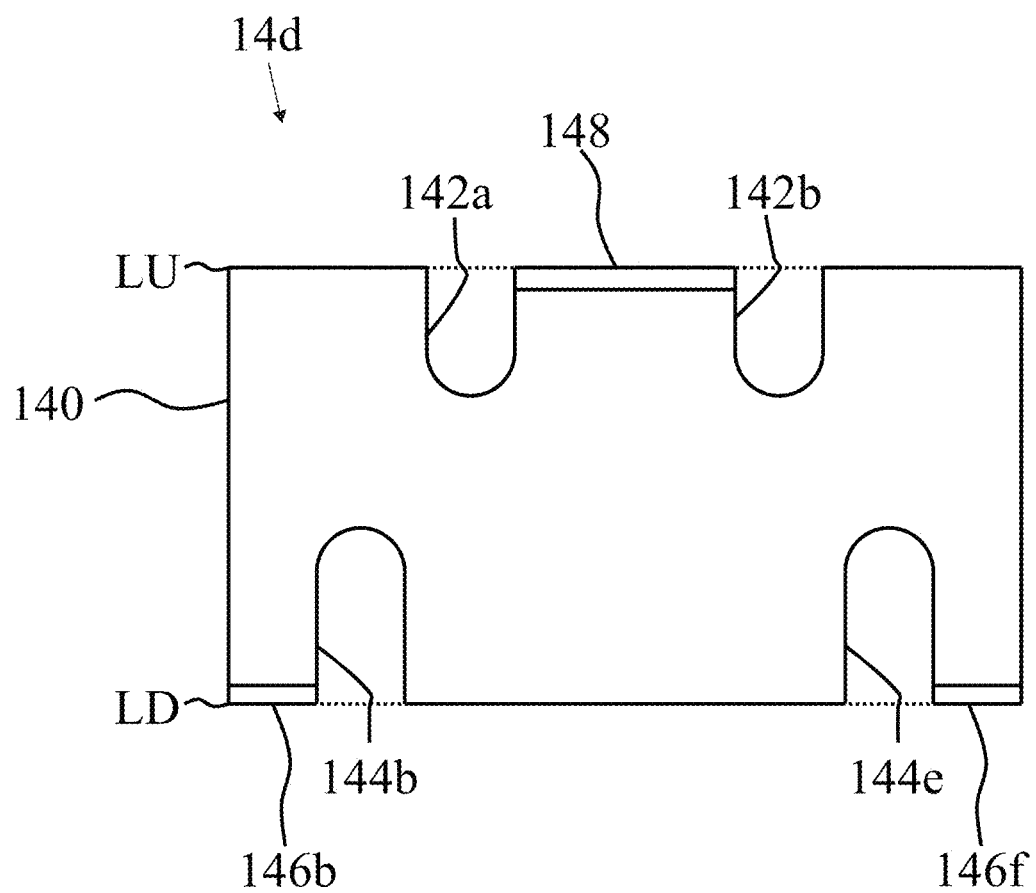
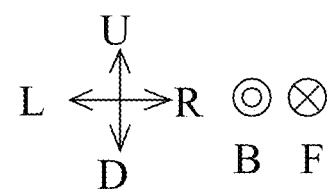

Fig. 17
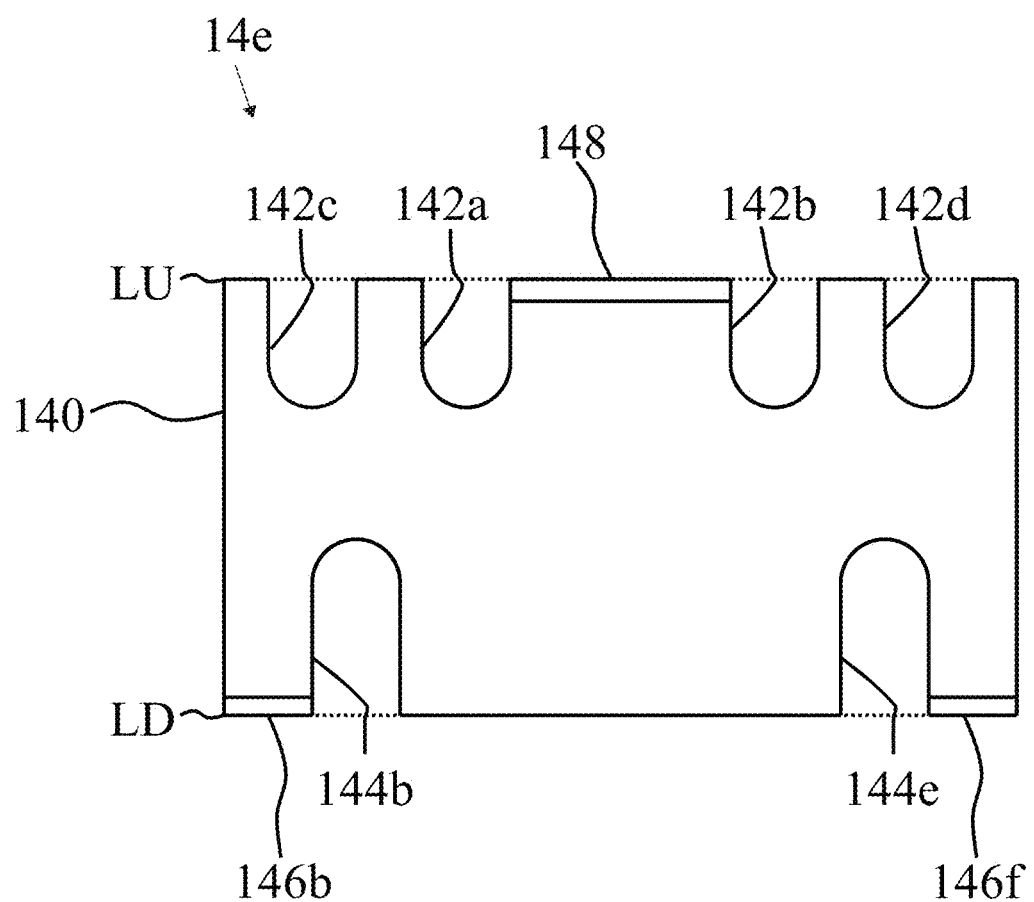
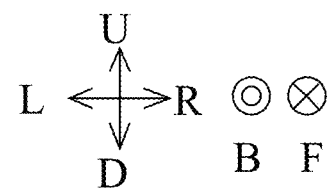

Fig. 18
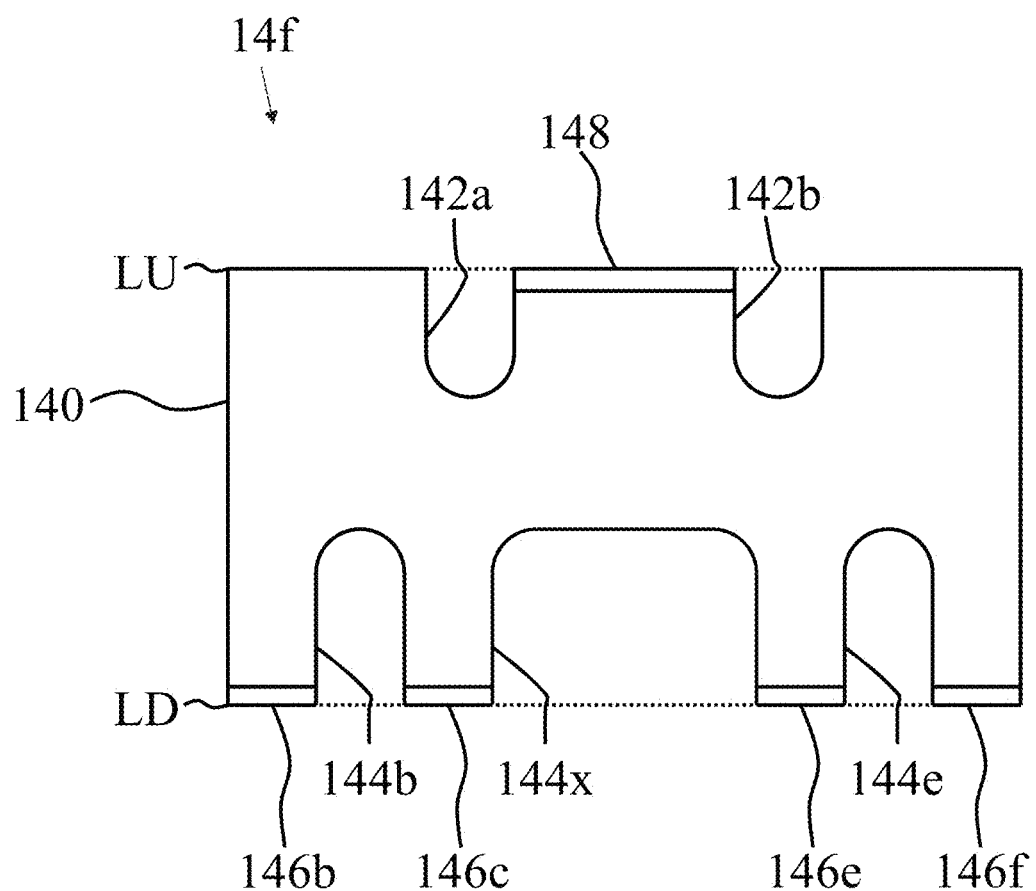
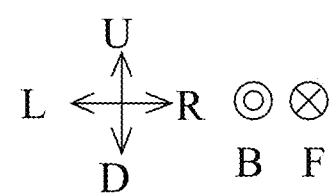

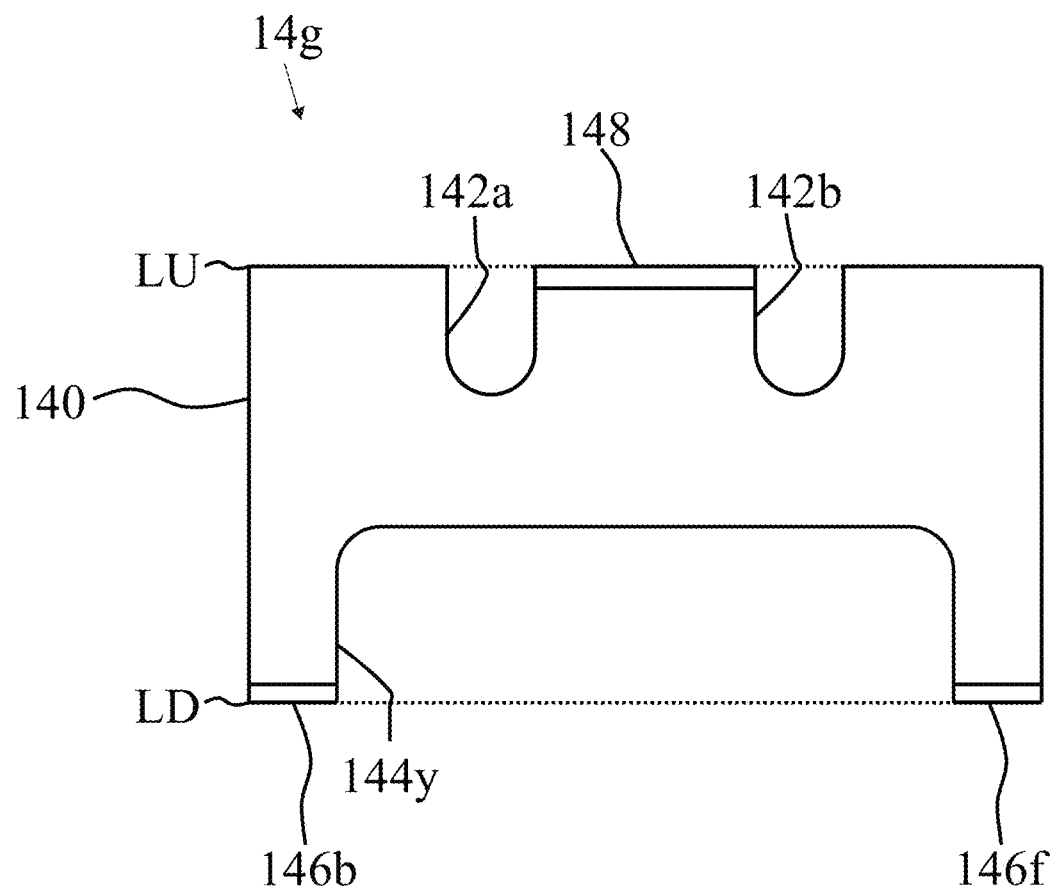
Fig. 19
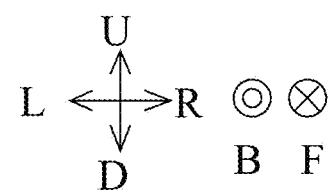

Fig. 20
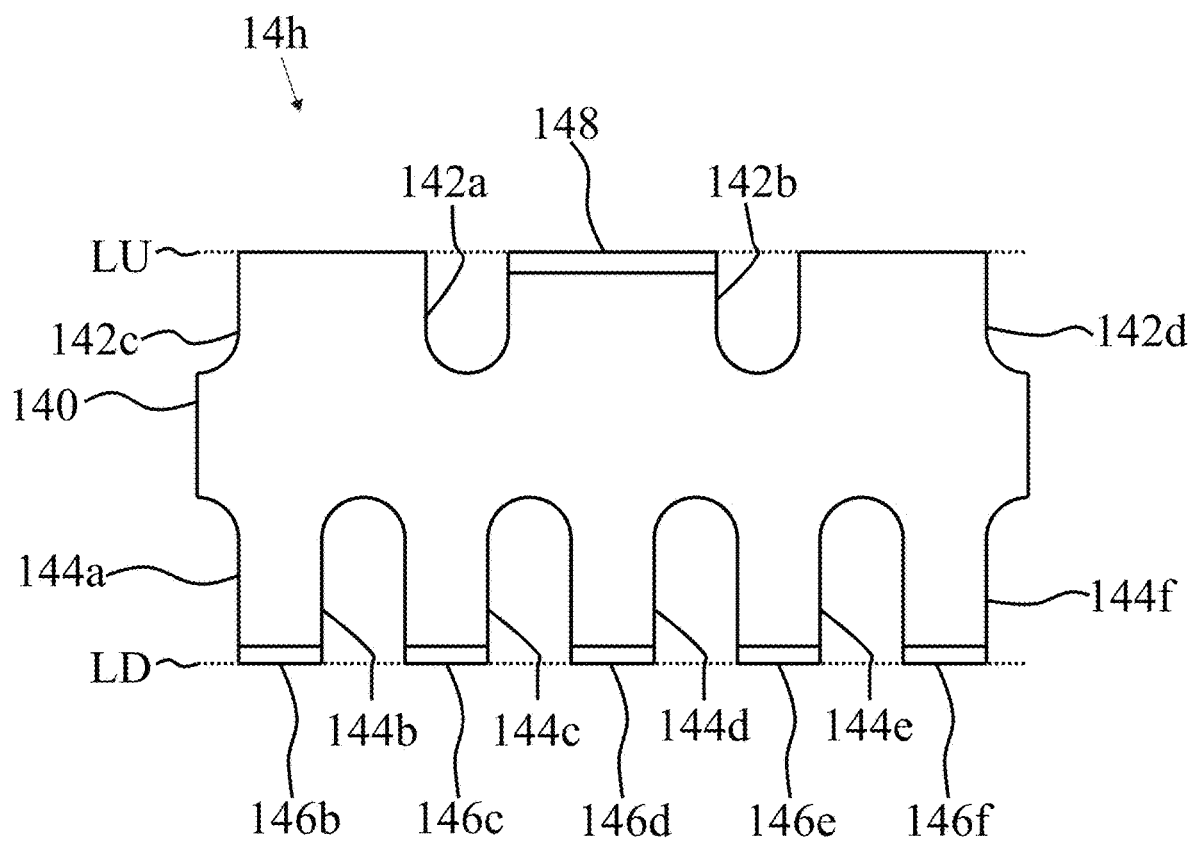
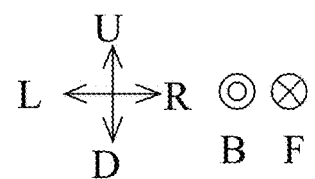

Fig. 22
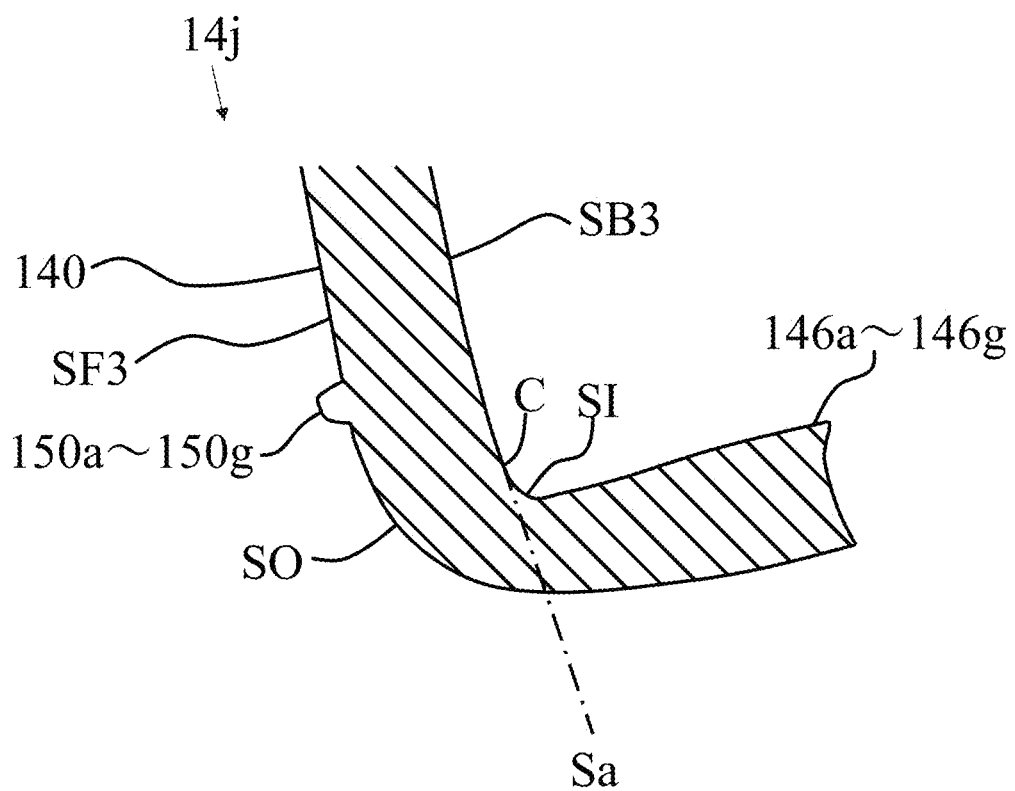
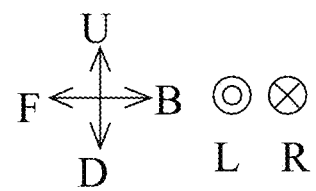

Fig. 23
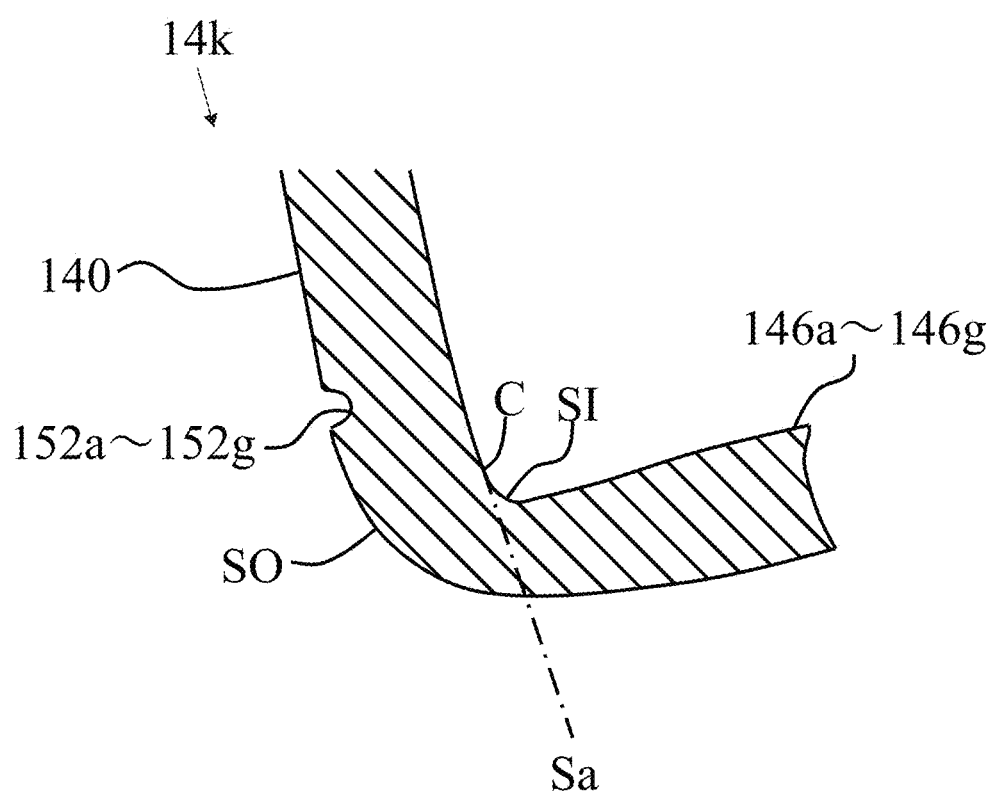
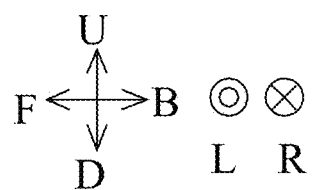

Fig. 24
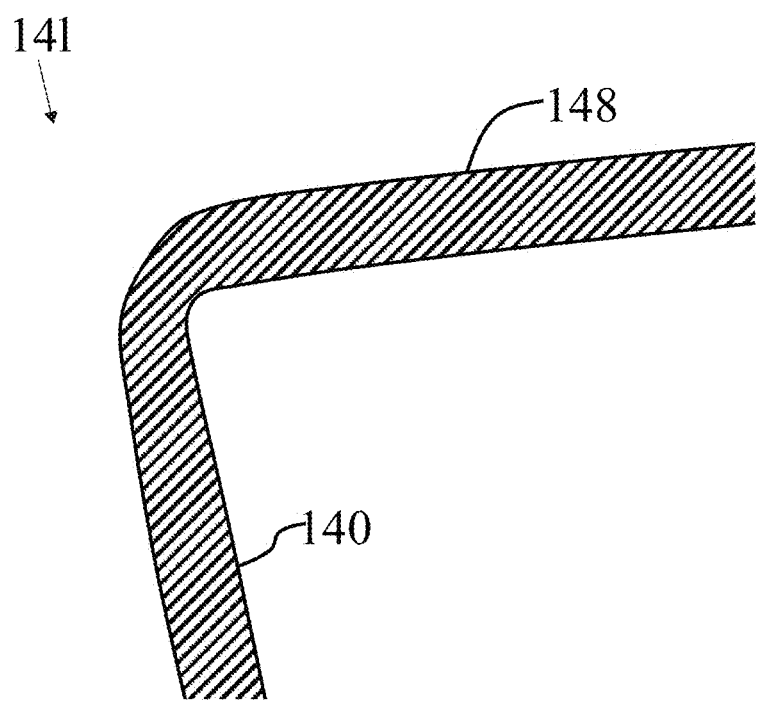
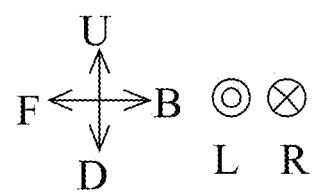

Fig. 25
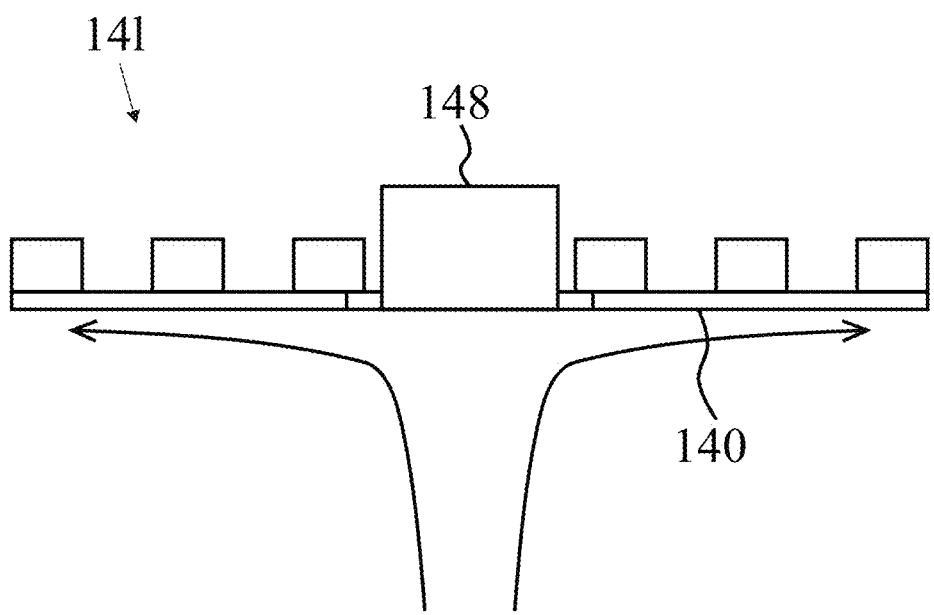
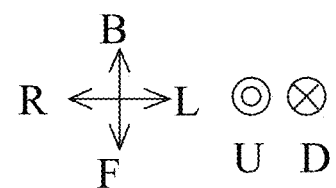

Fig. 27
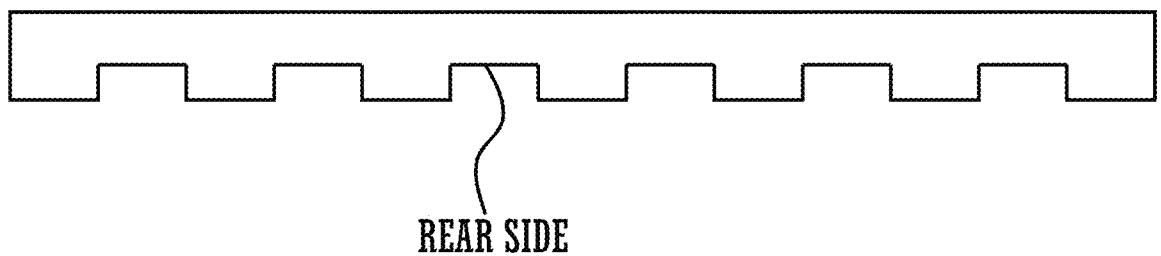
REAR SIDE
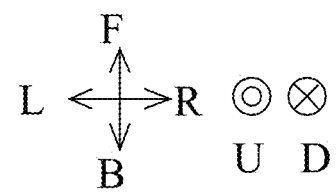

Fig. 30
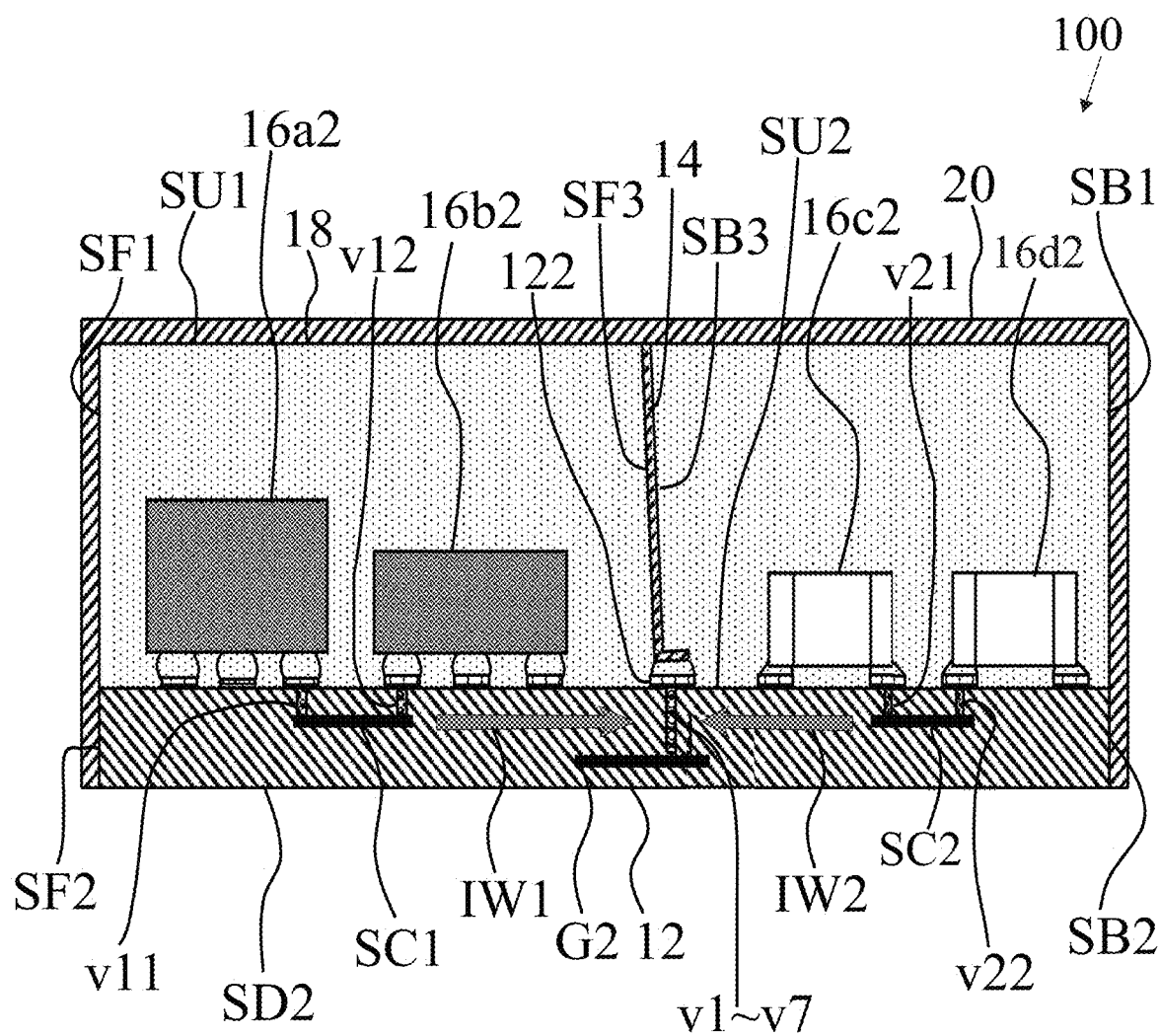
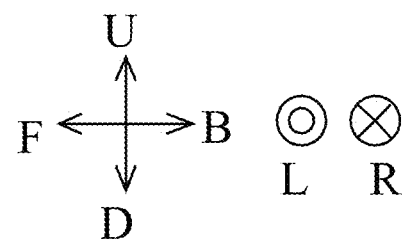

Fig. 33
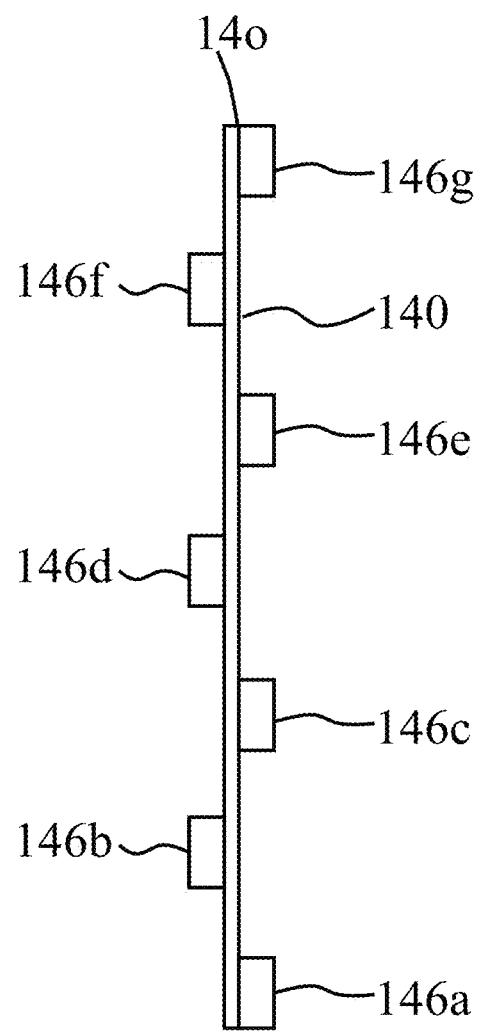
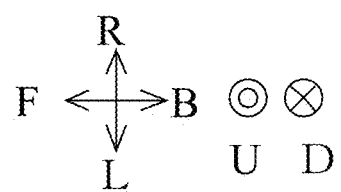

Fig. 34
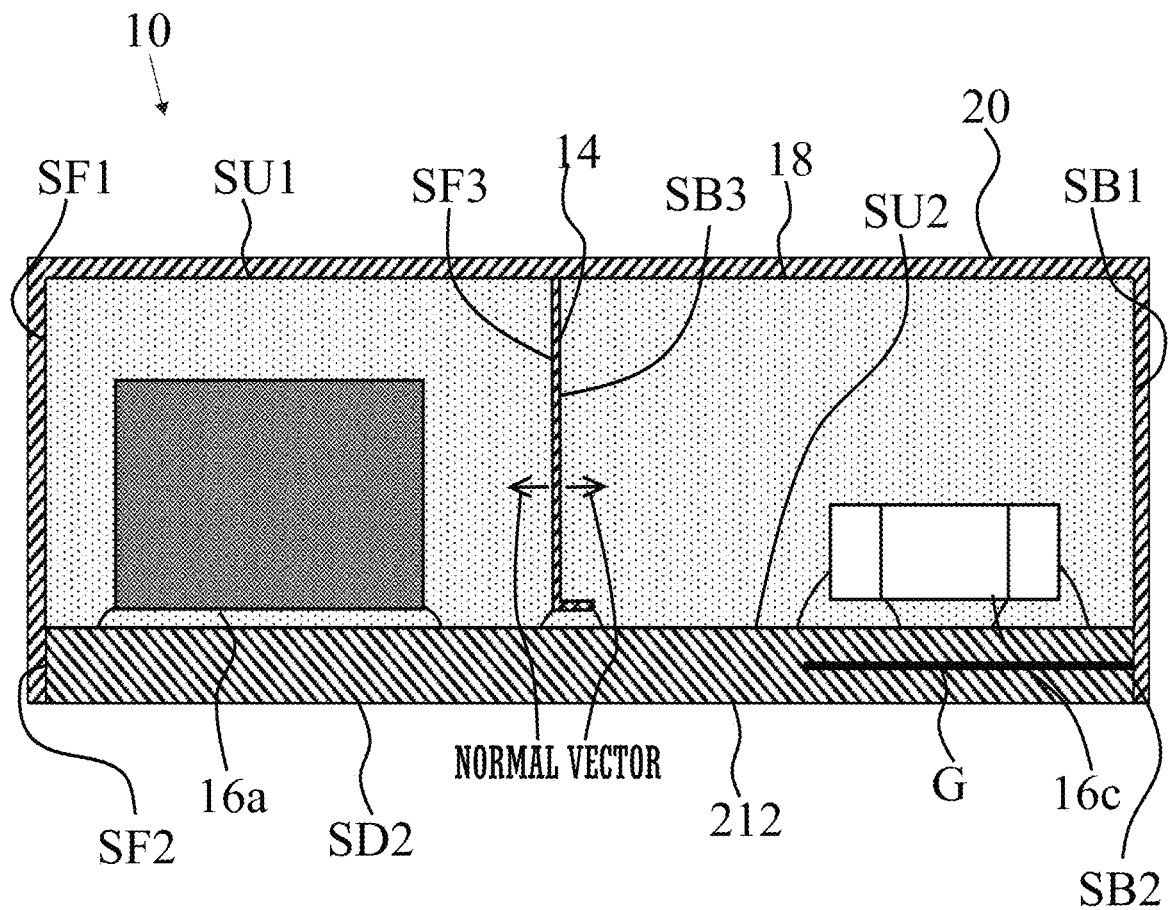
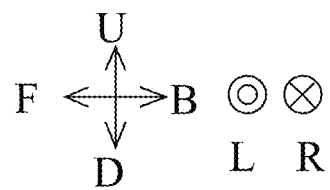

MODULE

CROSS REFERENCE TO RELATED APPLICATION

This is a continuation of International Application No. PCT/JP2021/027642 filed on Jul. 27, 2021 which claims priority from Japanese Patent Application No. 2020-136644 filed on Aug. 13, 2020 and Japanese Patent Application No. 2021-005119 filed on Jan. 15, 2021. The contents of these applications are incorporated herein by reference in their entireties.

BACKGROUND OF THE DISCLOSURE

Field of the Disclosure

The present disclosure relates to a module including a substrate on which an electronic component is mounted.

Description of the Related Art

As a disclosure related to the module according to the related art, for example, a high frequency module described in Patent Literature 1 is known. The high frequency module includes a substrate, a surface mount element, a metal wall, a resin molding portion, and a metal thin film. The surface mount element is mounted on the upper surface of the substrate. The metal wall extends upward from the upper surface of the substrate. The resin molding portion seals the metal wall and the surface mount element. The metal thin film covers the upper surface of the resin molding portion. In this high frequency module, a groove is provided in an upper part of the metal wall. This allows the resin having fluidity to pass through the groove at the time of forming the resin molding portion. As a result, the metal wall is suppressed from hindering the formation of the resin molding portion.

Patent Literature 1

Japanese Patent Unexamined Publication No. 2007-294965 bulletin

BRIEF SUMMARY OF THE DISCLOSURE

Meanwhile, in the high frequency module described in Patent Literature 1, a groove is provided in the upper part of the metal wall. Therefore, at the time of forming the resin molding portion, a part other than the upper part of the metal wall receives pressure from the resin having fluidity. As a result, the metal wall may collapse due to pressure.

Therefore, a possible benefit of the present disclosure is to provide a module capable of suppressing falling of a metal member at the time of forming a sealing resin layer.

A module according to an embodiment of the present disclosure includes: a substrate having an upper main surface and a lower main surface arranged in an up-down direction; a metal member provided on the upper main surface of the substrate; a first electronic component and a second electronic component mounted on the upper main surface of the substrate; and a sealing resin layer provided on the upper main surface of the substrate and covering the metal member, the first electronic component, and the second electronic component, wherein the metal member includes a plate-shaped portion and one or more foot portions, the plate-shaped portion has a front main surface and a back main surface arranged in a front-back direction when viewed in an up-down direction, the first electronic component is disposed in front of the metal member, the second electronic component is disposed behind the metal member, when viewed in the front-back direction, a line connecting a lower end of the plate-shaped portion in a left-right direction is defined as a lower side, the one or more foot portions extend forward or backward from the lower side by bending the metal member at the lower side of the plate-shaped portion, and a line extending in a predetermined direction is provided on the front main surface, the back main surface, an outer surface of a portion where the metal member is bent, and an inner surface of a portion where the metal member is bent.

The module according to the present disclosure can suppress the metal member from falling down at the time of forming the sealing resin layer.

BRIEF DESCRIPTION OF THE SEVERAL VIEWS OF THE DRAWINGS

FIG. 1 is a perspective view of a module 10.
FIG. 3 is a cross-sectional view of the module 10 taken along line A-A.
FIG. 12 is a photograph of an upper surface SU1 of a sealing resin layer 18 immediately after the sealing resin layer 18 is ground.
FIG. 13 is a rear view of a metal member 14a according to a first modification.
FIG. 14 is a rear view of a metal member 14b according to a second modification.
FIG. 16 is a rear view of a metal member 14d according to a fourth modification.
FIG. 17 is a rear view of a metal member 14e according to a fifth modification.
FIG. 18 is a rear view of a metal member 14f according to a sixth modification.
FIG. 19 is a rear view of a metal member 14g according to a seventh modification.
FIG. 20 is a rear view of a metal member 14h according to an eighth modification.
FIG. 22 is a cross-sectional view of foot portions 146a to 146g of a metal member 14j according to a tenth modification.
FIG. 23 is a cross-sectional view of foot portions 146a to 146g of a metal member 14k according to an eleventh modification.

FIG. 24 is a cross-sectional view at the center in the left-right direction of a top surface portion 148 of a metal member 141 according to a twelfth modification.

FIG. 25 is a top view of the metal member 141 according to the twelfth modification.

FIG. 26 is a top view of a mounting electrode 122a.

FIG. 27 is a top view of a mounting electrode 122b.

FIG. 28 is a rear view of a metal member 14m and a mounting electrode 122a.

FIG. 30 is a cross-sectional view of the module 100 taken along line A-A.

FIG. 33 is a top view of a metal member 14o.

FIG. 34 is a cross-sectional view of a module 10 according to an eighteenth modification.

DETAILED DESCRIPTION OF THE DISCLOSURE

Embodiments

[Structure of Module]

Figure 2:
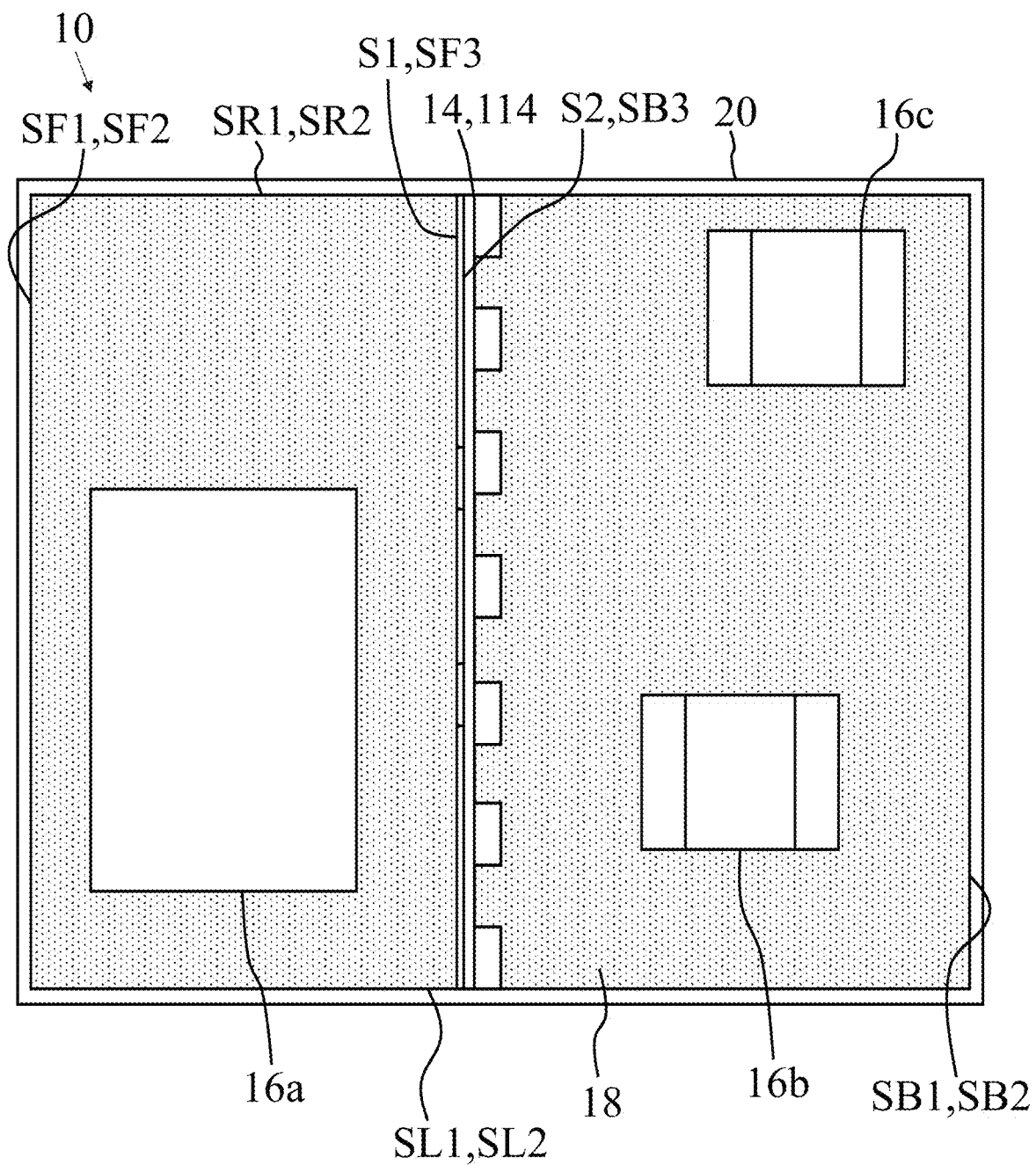
FIG. 2 is a top view of the module 10.
Figure 4:
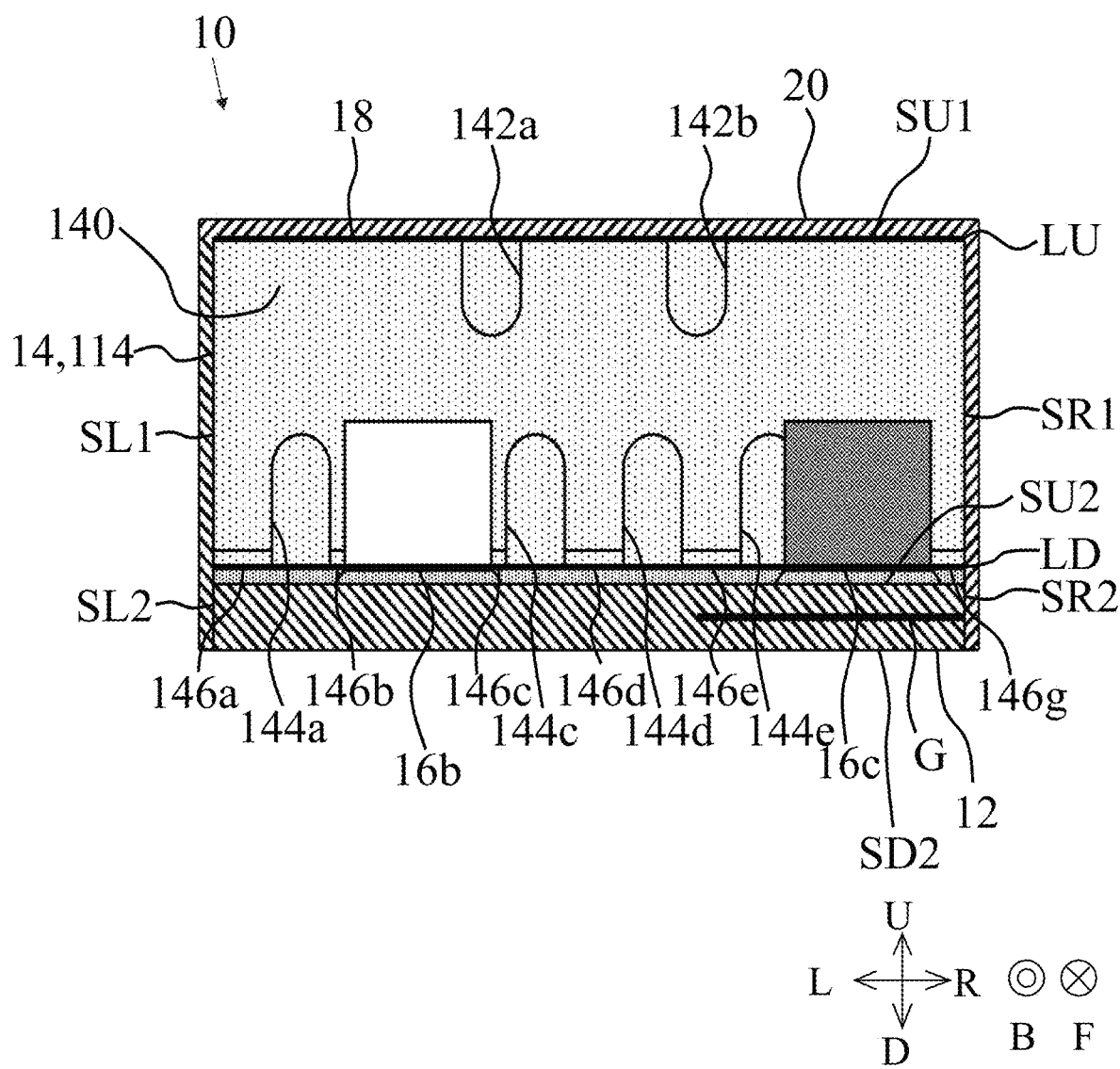
FIG. 4 is a cross-sectional view of the module 10 taken along line B-B.
Figure 5:
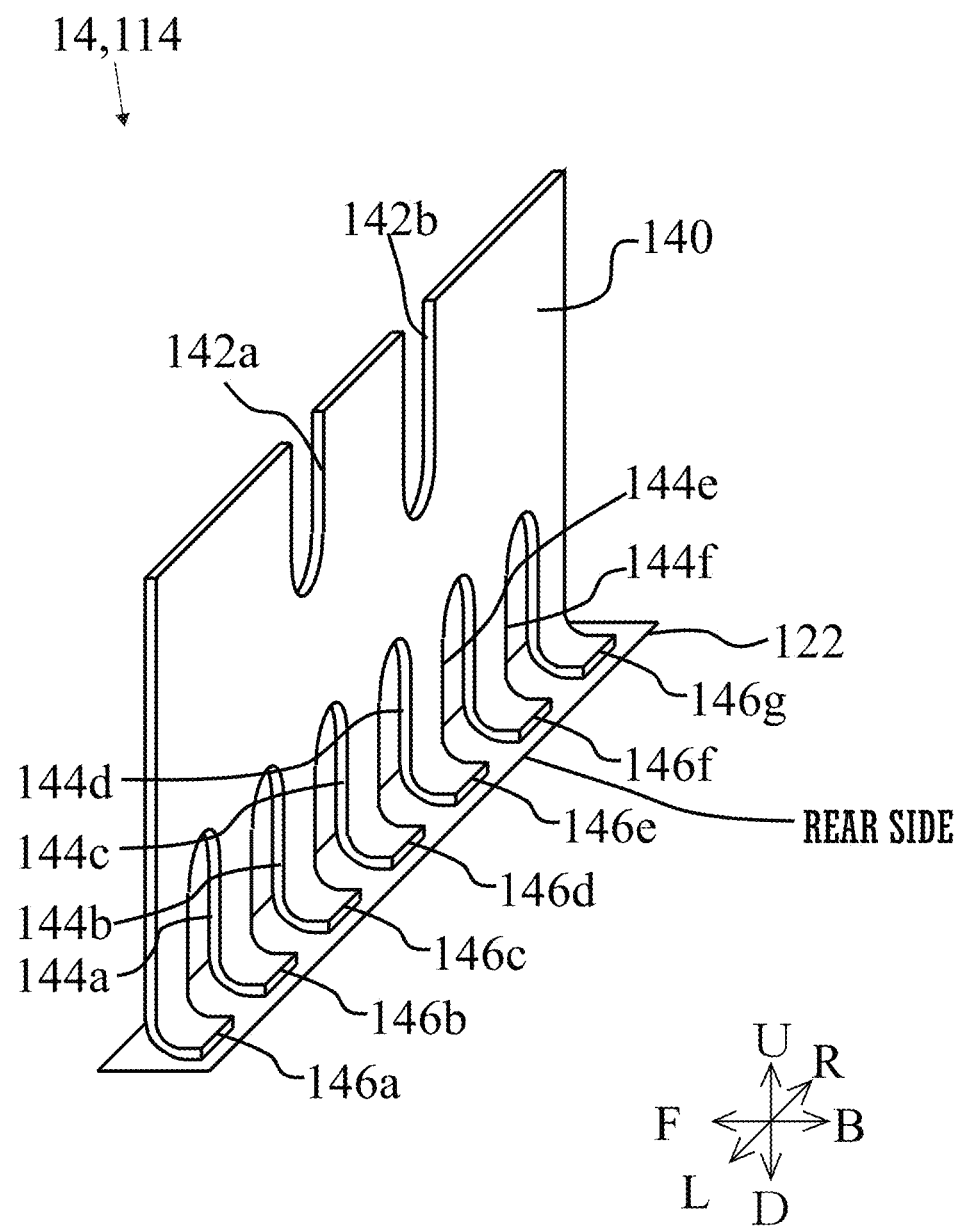
FIG. 5 is a perspective view of a metal member 14.
Figure 6:
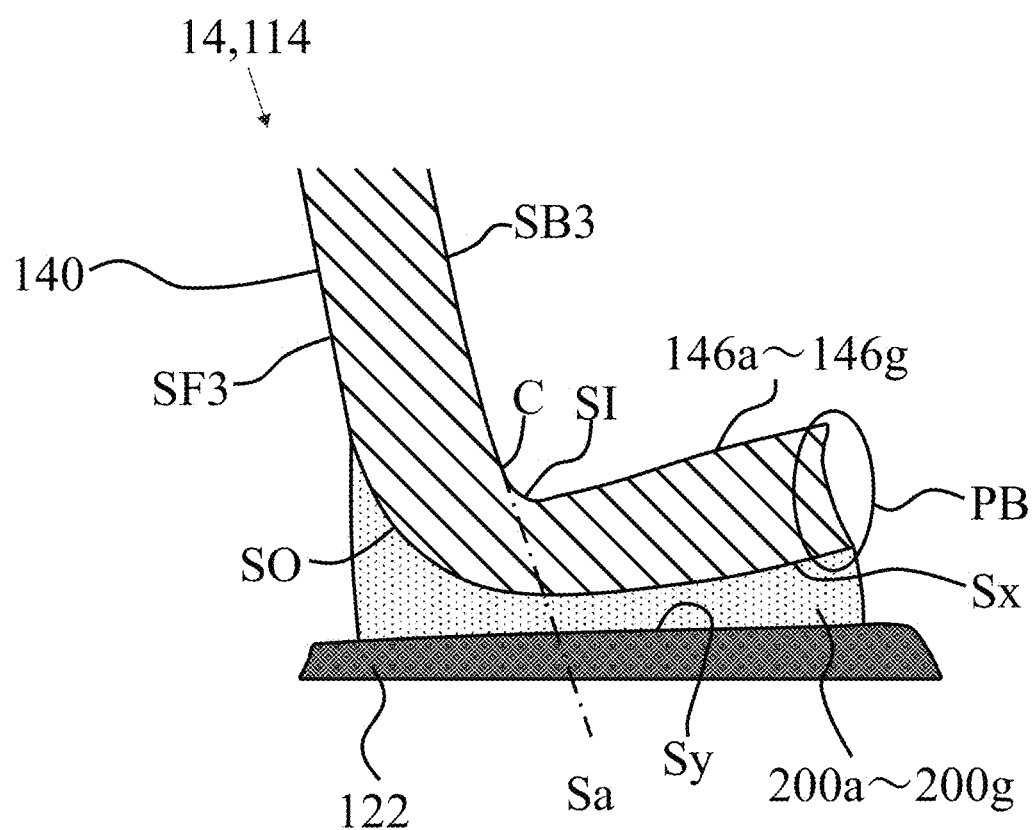
FIG. 6 is a cross-sectional view of foot portions 146a to 146g.
Figure 7:
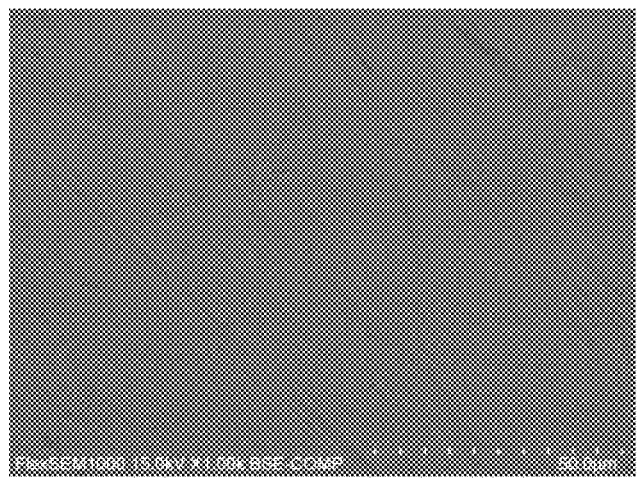
FIG. 7 is a photograph of a front main surface SF3.
Figure 8:
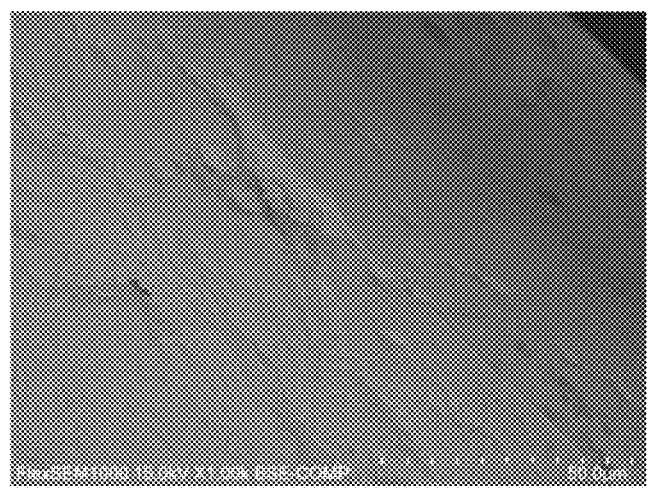
FIG. 8 is a photograph of an outer surface SO.

Hereinafter, a structure of a module 10 according to an embodiment of the present disclosure will be described with reference to the drawings. FIG. 1 is a perspective view of a module 10. In FIG. 1, the inside of the module 10 is seen through. FIG. 2 is a top view of the module 10. In FIG. 2, the inside of the module 10 is seen through. FIG. 3 is a cross-sectional view of the module 10 taken along line A-A. FIG. 4 is a cross-sectional view of the module 10 taken along line B-B. FIG. 5 is a perspective view of a metal member 14. FIG. 6 is a cross-sectional view of foot portions 146a to 146g. FIG. 7 is a photograph of a front main surface SF3. FIG. 8 is a photograph of an outer surface SO.

Hereinafter, the direction in the module 10 will be described. As illustrated in FIG. 1, a substrate 12 of the module 10 has a plate shape. Therefore, the direction in which an upper main surface SU2 and a lower main surface SD2 of the substrate 12 are arranged is defined as an up-down direction. When viewed in the up-down direction, a direction in which a front main surface SF3 and a back main surface SB3 of a plate-shaped portion 140 of the metal member 14 are arranged is defined as a front-back direction. In addition, a direction orthogonal to the front-back direction and the up-down direction is defined as a left-right direction. The up-down direction, the left-right direction, and the front-back direction are orthogonal to each other. However, the up-down direction, the left-right direction, and the front-back direction may not coincide with the up-down direction, the left-right direction, and the front-back direction in actual use of the module 10. In each drawing, the upward direction and the downward direction may be exchanged, the left direction and the right direction may be exchanged, or the front direction and the rear direction may be exchanged.

Hereinafter, definitions of terms in the present specification will be described. First, a positional relationship of members in the present specification will be defined. X to Z are members or parts constituting the module 10. In the present specification, X and Y arranged in the front-back direction indicate the following states. When X and Y are viewed in a direction perpendicular to the front-back direction, both X and Y are arranged on an arbitrary straight line indicating the front-back direction. In the present specification, X and Y arranged in the front-back direction when viewed in the up-down direction indicate the following states. When X and Y are viewed in the up-down direction, both X and Y are arranged on an arbitrary straight line indicating the front-back direction. In this case, when X and Y are viewed from the left-right direction different from the up-down direction, one of X and Y may not be arranged on arbitrary straight line indicating the front-back direction. X and Y may be in contact with each other. X and Y may be separated from each other. Z may be present between X and Y. This definition also applies to directions other than the front-back direction.

In the present specification, arranging X before Y refers to the following state. At least a part of X is disposed in a region through which Y passes when Y translates forward. Therefore, X may be within the region through which Y passes when Y translates forward, or may protrude from the region through which Y passes when Y translates forward. In this case, X and Y are aligned in the front-back direction. This definition also applies to directions other than the front-back direction.

In the present specification, arranging X before Y when viewed in the left-right direction refers to the following state. When viewed in the left-right direction, X and Y are arranged in the front-back direction, and when viewed in the left-right direction, a portion of X facing Y is disposed in front of Y. In this definition, X and Y may not be arranged in the front-back direction in three dimensions. This definition also applies to directions other than the front-back direction.

In the present specification, arranging X in front of Y refers to the following state. X is disposed in front of a plane passing through the front end of Y and orthogonal to the front-back direction. In this case, X and Y may be arranged in the front-back direction or may not be arranged in the front-back direction. This definition also applies to directions other than the front-back direction.

In the present specification, each part of X is defined as follows unless otherwise specified. The front part of X means the front half of X. The rear part of X means the rear half of X. The left part of X means the left half of X. The right part of X means the right half of X. The upper part of X means the upper half of X. The lower part of X means the lower half of X. The front end of X means an end of X in the front direction. The back end of X means an end of X in the rear direction. The left end of X means an end of X in the left direction. The right end of X means an end of X in the right direction. The upper end of X means an end of X in the upward direction. The lower end of X means an end of X in the downward direction. The front end portion of X means the front end of X and the vicinity thereof. The back end portion of X means the back end of X and the vicinity thereof. The left end portion of X means the left end of X and the vicinity thereof. The right end portion of X means the right end of X and the vicinity thereof. The upper end portion of X means the upper end of X and the vicinity thereof. The lower end portion of X means the lower end of X and the vicinity thereof.

When any two members in the present specification are defined as X and Y, the relationship between any two members has the following meaning. In the present specification, "X is supported by Y" includes a case where X is attached to Y so as not to be movable with respect to Y (that is, it is fixed) and a case where X is attached to Y so as to be movable with respect to Y. Further, "X is supported by Y"

includes both a case where X is directly attached to Y and a case where X is attached to Y via Z.

In the present specification, "X and Y are electrically connected" means that electricity is conducted between X and Y. Therefore, X and Y may be in contact with each other, or X and Y may not be in contact with each other. When X and Y are not in contact with each other, Z having conductivity is disposed between X and Y.

The module 10 is, for example, a high frequency module. The high frequency module is, for example, an analog front end module of a portable wireless communication device. However, the module 10 is not limited to the high frequency module. As illustrated in FIGS. 1 to 4, the module 10 includes a substrate 12, a metal member 14, electronic components 16a to 16c, a sealing resin layer 18, and a shield 20.

The substrate 12 is, for example, a multilayer wiring substrate having a structure in which a plurality of insulator layers made of a low-temperature co-fired ceramic, a high-temperature co-fired ceramic, glass epoxy, or the like is stacked. The substrate 12 has a plate shape. Therefore, the substrate 12 has an upper main surface SU2, a lower main surface SD2, a left surface SL2, a right surface SR2, a front surface SF2, and a back surface SB2. The substrate 12 has a rectangular shape when viewed in the up-down direction. An electric circuit is provided by a conductor layer in the inside, the upper main surface SU2, and the lower main surface SD2 of the substrate 12. In the present embodiment, the substrate 12 includes a ground conductor layer G as illustrated in FIGS. 3 and 4. The ground conductor layer G is provided inside the substrate 12. A ground potential is connected to the ground conductor layer G.

The metal member 14 is provided on the upper main surface SU2 of the substrate 12. The metal member 14 has a structure in which a metal plate 114 having a first main surface S1 and a second main surface S2 is bent. The metal member 14 is made of, for example, tough pitch copper. Note that brass, phosphor bronze, SUS, aluminum, or the like may be used instead of the tough pitch copper. The thickness of the metal member 14 is, for example, 50 μm. As illustrated in FIGS. 4 and 5, the metal member 14 includes the plate-shaped portion 140 and the foot portions 146a to 146g. The plate-shaped portion 140 has a plate shape. The plate-shaped portion 140 has the front main surface SF3 and the back main surface SB3. The front main surface SF3 and the back main surface SB3 are arranged in the front-back direction when viewed in the up-down direction. The front main surface SF3 is a part of the first main surface S1. The back main surface SB3 is a part of the second main surface S2. The plate-shaped portion 140 is provided on the upper main surface SU2 of the substrate 12. The plate-shaped portion 140 extends in the upward direction from the upper main surface SU2 of the substrate 12. However, as illustrated in FIG. 3, the plate-shaped portion 140 is slightly inclined forward with respect to the up-down direction. That is, the normal vector of the front main surface SF3 of the plate-shaped portion 140 has a slight component of the downward direction. The normal vector of back main surface SB3 of plate-shaped portion 140 has a slight component of the upward direction.

The plate-shaped portion 140 has a rectangular shape when viewed in the front-back direction. However, the plate-shaped portion 140 is provided with upper notches 142a and 142b and lower notches 144a to 144f. Therefore, strictly speaking, the plate-shaped portion 140 has a shape different from the rectangular shape when viewed in the front-back direction. Therefore, as illustrated in FIG. 4, when viewed in the front-back direction, a line connecting the upper end of the plate-shaped portion 140 in the left-right direction is defined as an upper side LU. When viewed in the front-back direction, a line connecting the lower end of the plate-shaped portion 140 in the left-right direction is defined as a lower side LD. The upper side LU is present at a position farther upward from the substrate 12 than the lower side LD. In addition, in the present specification, the notch is a recess formed in the outer edge of the plate-shaped portion 140 by partially missing the plate-shaped portion 140. The notch in the present specification includes, for example, a U-shaped defect extending from a side of a rectangular plate in a direction orthogonal to the side, and an L-shaped defect formed by removing a rectangular corner. In addition, the notch may be an angular U-shaped defect.

The upper notches 142a and 142b extend in the downward direction from the upper side LU. The upper notches 142a and 142b have a U shape when viewed in the front-back direction. That is, the upper notches 142a and 142b have a shape in which a rectangle having an upper side, a lower side, a left side, and a right side and a semicircle protruding in the downward direction from the lower side of the rectangle are combined. The lower ends of the upper notches 142a and 142b are located above the center of the plate-shaped portion 140 in the up-down direction when viewed in the front-back direction. The upper notch 142a is located on the left of the upper notch 142b. The lengths in the up-down direction of the upper notches 142a and 142b are, for example, half or less of the length in the up-down direction of the plate-shaped portion 140. The widths of the upper notches 142a and 142b in the left-right direction are, for example, 150 μm.

The lower notches 144a to 144f extend in the upward direction from the lower side LD. The lower notches 144a to 144f have a U-shape in which the upper and lower sides are inverted when viewed in the front-back direction. That is, the lower notches 144a to 144f have a shape in which a rectangle and a semicircle protruding upward from the upper side of the rectangle are combined. The upper ends of the lower notches 144a to 144f are located below the center of the plate-shaped portion 140 in the up-down direction when viewed in the front-back direction. The lower notches 144a to 144f are arranged in a line in this order from left to right. The lower notches 144a to 144f are arranged at equal intervals in the left-right direction when viewed in the front-back direction. The lengths in the up-down direction of the lower notches 144a to 144f are, for example, half or less of the length in the up-down direction of the plate-shaped portion 140. The widths of the lower notches 144a to 144f in the left-right direction are, for example, 150 μm.

Here, a positional relationship between the upper notches 142a and 142b and the lower notches 144a to 144f will be described. The upper notches 142a and 142b are displaced in the left-right direction from the lower notches 144a to 144f when viewed in the up-down direction. The upper notch 142a is located between the lower notch 144b and the lower notch 144c in the left-right direction when viewed in the up-down direction. The upper notch 142b is located between the lower notch 144d and the lower notch 144e in the left-right direction when viewed in the up-down direction. This prevents the upper notches 142a and 142b and the lower notches 144a to 144f from being too close to each other. The shortest distance between the upper notches 142a and 142b and the lower notches 144a to 144f is 1.5 times or more the plate thickness of the plate-shaped portion 140 in the drawing. The shortest distance between the upper notches 142a and 142b and the lower notches 144a to 144f is more preferably twice or more the plate thickness of the plate-shaped portion 140.

As illustrated in FIG. 6, all of the foot portions 146a to 146g extend backward from the lower side LD by bending the metal member 14. Therefore, all of the foot portions 146a to 146g extend in the same direction with respect to the plate-shaped portion 140. Therefore, as illustrated in FIGS. 3 and 6, the metal member 14 has an L shape when viewed in the left-right direction. Here, boundaries between the foot portions 146a to 146g and the plate-shaped portion 140 will be described. As illustrated in FIG. 6, the plate-shaped portion 140 is a portion located in front of a virtual plane Sa including the back main surface SB3 of the plate-shaped portion 140. On the other hand, the foot portions 146a to 146g are portions located behind the virtual plane Sa including the back main surface SB3 of the plate-shaped portion 140. Therefore, the foot portions 146a to 146g extend backward from the lower end portion of the plate-shaped portion 140.

The foot portions 146a to 146g are fixed to the upper main surface SU2 of the substrate 12. More specifically, as illustrated in FIG. 5, the substrate 12 includes a mounting electrode 122. A mounting electrode 122 is a part of the upper main surface SU2 of the substrate 12. The mounting electrode 122 is one electrode. The mounting electrode 122 has a rectangular shape having long sides extending in the left-right direction when viewed in the up-down direction. Therefore, the mounting electrode 122 is one electrode. The mounting electrode 122 is electrically connected to the ground conductor layer G. Therefore, the mounting electrode 122 is connected to the ground potential. The foot portions 146a to 146g are fixed to the mounting electrode 122 with solders 200a to 200g. Thus, the metal member 14 is connected to the ground potential.

Next, the mounting of the foot portions 146a to 146g on the mounting electrode 122 will be described with reference to FIG. 6. As illustrated in FIG. 3, the plate-shaped portion 140 is slightly inclined forward with respect to the up-down direction. Thus, the upper end of the plate-shaped portion 140 is located in front of the lower end of the plate-shaped portion 140. The inclination angle of the plate-shaped portion 140 with respect to the up-down direction is, for example, larger than 0° and equal to or smaller than 15°. Thus, as illustrated in FIG. 6, the foot portions 146a to 146g extend from the lower end portion of the plate-shaped portion 140 toward the rear upper direction. Therefore, the interval in the up-down direction between a lower surface Sx of each of the foot portions 146a to 146g and an upper surface Sy of the mounting electrode 122 increases toward the front. Each of the solders 200a to 200g is provided between the lower surface Sx of the foot portions 146a to 146g and the upper surface Sy of the mounting electrode 122. As described above, since the interval in the up-down direction between the lower surfaces Sx of the foot portions 146a to 146g and the upper surface Sy of the mounting electrode 122 becomes larger toward the rear, voids generated in the solders 200a to 200g are easily discharged backward from the solders 200a to 200g.

The foot portions 146a to 146g are formed by bending a part of the metal member 14. An inner surface of a portion where the metal member 14 is bent in an arc shape is defined as an inner surface SI. The inner surface SI is connected to the back main surface SB3. An outer surface of a portion where the metal member 14 is bent in an arc shape is defined as an outer surface SO. The outer surface SO is connected to the front main surface SF3. The inner surface SI and the outer surface SO have an arc shape when viewed in the left-right direction. However, the radius of curvature of the outer surface SO is larger than the radius of curvature of the inner surface SI. Therefore, tensile stress is generated on the outer surface SO. Compressive stress is generated on the inner surface SI.

The distance between the outer surface SO of the plate-shaped portion 140 and the upper surface Sy of the mounting electrode 122 increases toward the front. Thus, voids generated in the solders 200a to 200g are easily released forward from the solders 200a to 200g.

The metal member 14 is a rolled material. More specifically, the metal member 14 is a member obtained by punching and bending the metal plate 114 which is a rolled material. A plurality of lines extending in a predetermined direction are provided on the entire first main surface S1 and the entire second main surface S2 of the metal plate 114. Therefore, as illustrated in FIGS. 7 and 8, a line extending in a predetermined direction is provided on the front main surface SF3, the back main surface SB3, the outer surface SO of the portion where the metal member 14 is bent, and the inner surface SI of the portion where the metal member 14 is bent. The plurality of lines are rolling flaws formed on the first main surface S1 and the second main surface S2 of the metal plate 114 at the time of rolling the metal plate 114. The rolling direction of the metal plate 114 is the left-right direction. Therefore, a plurality of lines (streaks) extending in the left-right direction (not illustrated) are formed on the first main surface S1 and the second main surface S2 of the metal plate 114. Therefore, in the present embodiment, the predetermined direction is the left-right direction.

Here, the foot portions 146a to 146g extend backward from the lower side LD. In this case, the outer surface SO of the portion where the metal member 14 is bent is located on the first main surface S1. On the first main surface S1 and the second main surface S2, slight unevenness is formed by a plurality of lines. When the metal member 14 is bent to form the foot portions 146a to 146g, the plurality of lines formed on the outer surface SO of the metal member 14 are extended in the width direction of the lines. Therefore, the depth of the plurality of lines formed on the outer surface SO of the metal member 14 becomes shallow. As a result, the surface roughness of the outer surface SO of the portion where the metal member 14 is bent is smaller than the surface roughness of the front main surface SF3. Further, as illustrated in FIG. 8, a crack is formed on the outer surface SO of the portion where the metal member 14 is bent.

As illustrated in FIG. 6, the back end portion PB of each of the foot portions 146a to 146g has a shape in which the upper end and the lower end protrude backward from the center. Thus, the solders 200a to 200g are less likely to wet upward at a back end portion PB of the foot portions 146a to 146g.

Here, a positional relationship between the foot portions 146a to 146g and the lower notches 144a to 144f will be described. As illustrated in FIG. 5, the foot portion 146a, the lower notch 144a, the foot portion 146b, the lower notch 144b, the foot portion 146c, the lower notch 144c, the foot portion 146d, the lower notch 144d, the foot portion 146e, the lower notch 144e, the foot portion 146f, the lower notch 144f, and the foot portion 146g are arranged in this order from left to right when viewed in the front-back direction. The lower notches 144a to 144f have the same shape. Therefore, the foot portions 146a to 146g are arranged at equal intervals in the left-right direction when viewed in the front-back direction. The foot portions 146a to 146g have the same shape. Therefore, the lower notches 144a to 144f are arranged at equal intervals in the left-right direction when viewed in the front-back direction.

Outer edges of the foot portions 146a to 146g are connected to outer edges of the lower notches 144a to 144f. Therefore, the lower notches 144a to 144f are located on at least one of the left and right of the foot portions 146a to 146g. Therefore, the foot portions 146a to 146g include the foot portions 146b to 146f (first foot portions) located between the lower notches 144a to 144f in the left-right direction when viewed in the front-back direction. The lower notches 144a to 144f are located on both the left and right of the foot portions 146b to 146f. Further, the foot portions 146a to 146g include the foot portion 146a (second foot portion) disposed at the left end portion of the lower side LD when viewed in the front-back direction. The lower notch 144a is located on the right of the foot portion 146a. The foot portions 146a to 146g include the foot portion 146g (second foot portion) disposed at the right end portion of the lower side LD when viewed in the front-back direction. The lower notch 144f is located on the left of the foot portion 146g.

As illustrated in FIGS. 1 and 3, an electronic component 16a (first electronic component) is mounted on the upper main surface SU2 of the substrate 12. A method of mounting the electronic component 16a is, for example, mounting by soldering. The electronic component 16a is a semiconductor element such as an IC or a power amplifier (PA), or a chip component such as a chip inductor, a chip capacitor, or a chip resistor. As illustrated in FIG. 2, the electronic component 16a is disposed in front of the metal member 14. In the present embodiment, the electronic component 16a is disposed in front of the metal member 14. Therefore, the electronic component 16a overlaps the metal member 14 when viewed in the front-back direction. The left end of the electronic component 16a is located to the right of the left end of the metal member 14. The right end of the electronic component 16a is located to the left of the right end of the metal member 14. The upper end of the electronic component 16a is located below the upper end of the metal member 14.

Electronic components 16b and 16c (second electronic components) are mounted on the upper main surface SU2 of the substrate 12. The method of mounting the electronic components 16b and 16c is, for example, mounting by soldering. The electronic components 16b and 16c are semiconductor elements such as ICs and power amplifiers (PAs), chip components such as chip inductors, chip capacitors, and chip resistors. As illustrated in FIG. 2, the electronic components 16b and 16c are disposed behind the metal member 14. In the present embodiment, the electronic components 16b and 16c are disposed behind the metal member 14. Therefore, the electronic components 16b and 16c overlap the metal member 14 when viewed in the front-back direction. The left end of the electronic component 16b and the left end of the electronic component 16c are located to the right of the left end of the metal member 14. The right end of the electronic component 16b and the right end of the electronic component 16c are located to the left of the right end of the metal member 14. The upper end of the electronic component 16a is located below the upper end of the metal member 14.

As illustrated in FIGS. 1 and 3, the sealing resin layer 18 is provided on the upper main surface SU2 of the substrate 12. The sealing resin layer 18 covers the metal member 14 and the electronic components 16a to 16c. Thus, the sealing resin layer 18 protects the metal member 14 and the electronic components 16a to 16c. The material of the sealing resin layer 18 is, for example, an epoxy resin. The sealing resin layer 18 has a rectangular parallelepiped shape. Therefore, the sealing resin layer 18 has an upper surface SU1, a lower surface SD1, a left surface SL1, a right surface SR1, a front surface SF1, and a back surface SB1. The left end of the plate-shaped portion 140 is located on the left surface SL1 of the sealing resin layer 18. In the present embodiment, the left end of the plate-shaped portion 140 is exposed from the sealing resin layer 18 on the left surface SL1 of the sealing resin layer 18. The right end of the plate-shaped portion 140 is located on the right surface SR1 of the sealing resin layer 18. In the present embodiment, the right end of the plate-shaped portion 140 is exposed from the sealing resin layer 18 on the right surface SR1 of the sealing resin layer 18. The upper end of the plate-shaped portion 140 is located on the upper surface SU1 of the sealing resin layer 18. In the present embodiment, the upper end of the plate-shaped portion 140 is exposed from the sealing resin layer 18 on the upper surface SU1 of the sealing resin layer 18.

The shield 20 covers the upper surface SU1 of the sealing resin layer 18. In the present embodiment, the shield 20 covers the upper surface SU1, the left surface SL1, the right surface SR1, the front surface SF1, and the back surface SB1 of the sealing resin layer 18, and the left surface SL2, the right surface SR2, the front surface SF2, and the back surface SB2 of the substrate 12. The shield 20 is electrically connected to the metal member 14. Specifically, the shield 20 is in contact with a portion where the plate-shaped portion 140 is exposed from the sealing resin layer 18. Further, the shield 20 is connected to the ground conductor layer G exposed from the back surface SB2 of the substrate 12. Thus, the shield 20 is connected to the ground potential. The shield 20 has a multilayer structure. Specifically, the shield 20 includes an adhesion layer, a conductive layer, and a protective layer. The adhesion layer, the conductive layer, and the protective layer are stacked in this order from the lower layer to the upper layer. The adhesion layer serves to increase adhesion strength between the conductive layer and the sealing resin layer 18. The material of the adhesion layer is, for example, stainless steel (SUS). The conductive layer serves a shielding function. The material of the conductive layer is, for example, a metal such as Cu, Ag, or Al. The protective layer serves to prevent corrosion of the conductive layer. The material of the protective layer is, for example, SUS.

[Method for Manufacturing Module]

Figure 9:
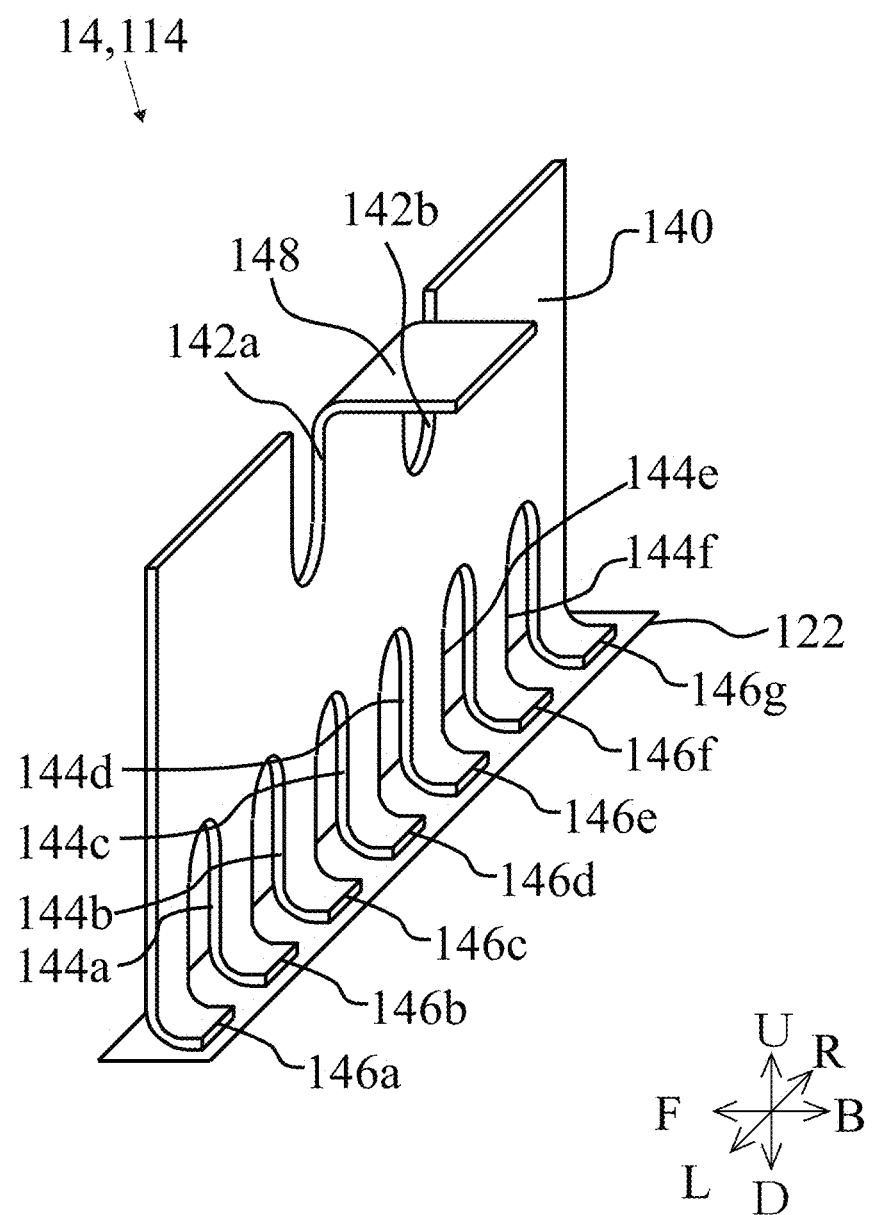
FIG. 9 is a perspective view at the time of mounting the metal member 14.
Figure 10:
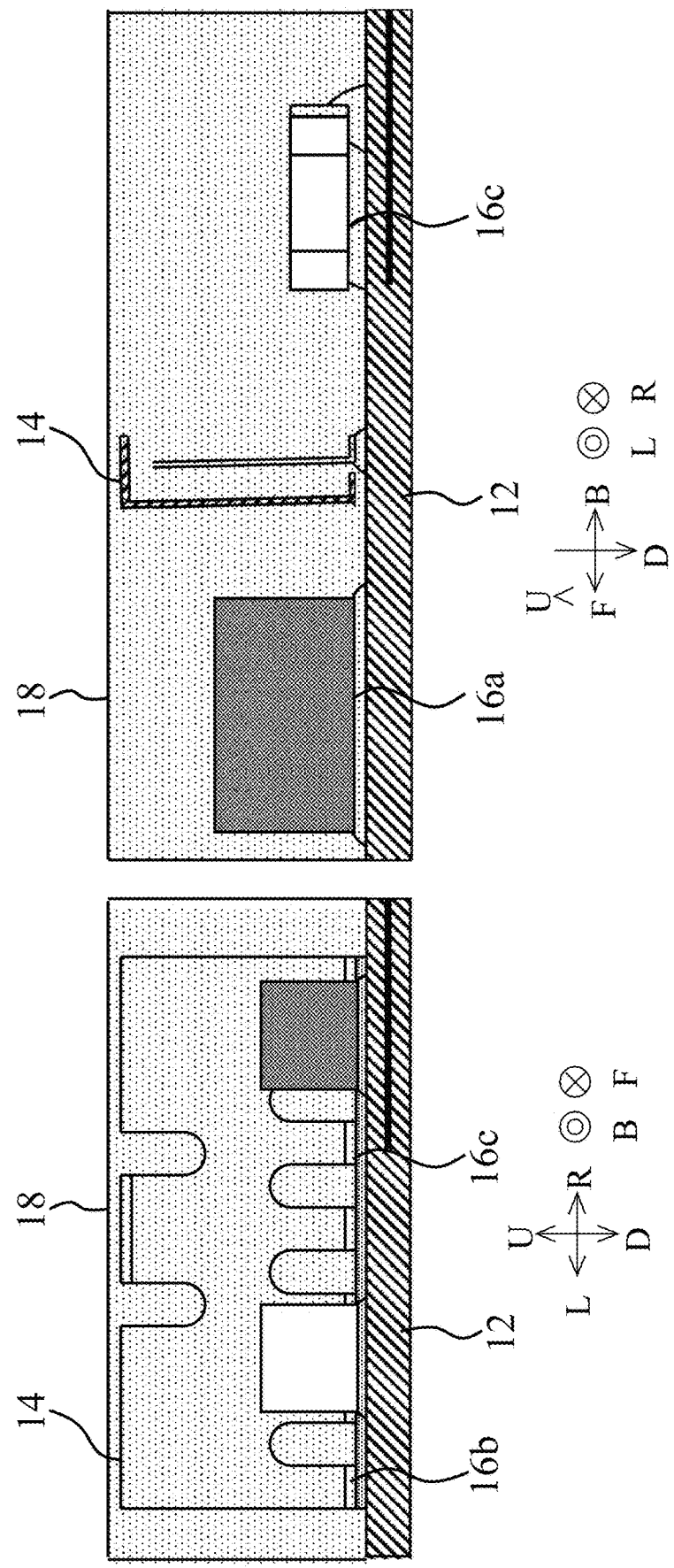
FIG. 10 is a cross-sectional view at the time of manufacturing the module 10.
Figure 11:
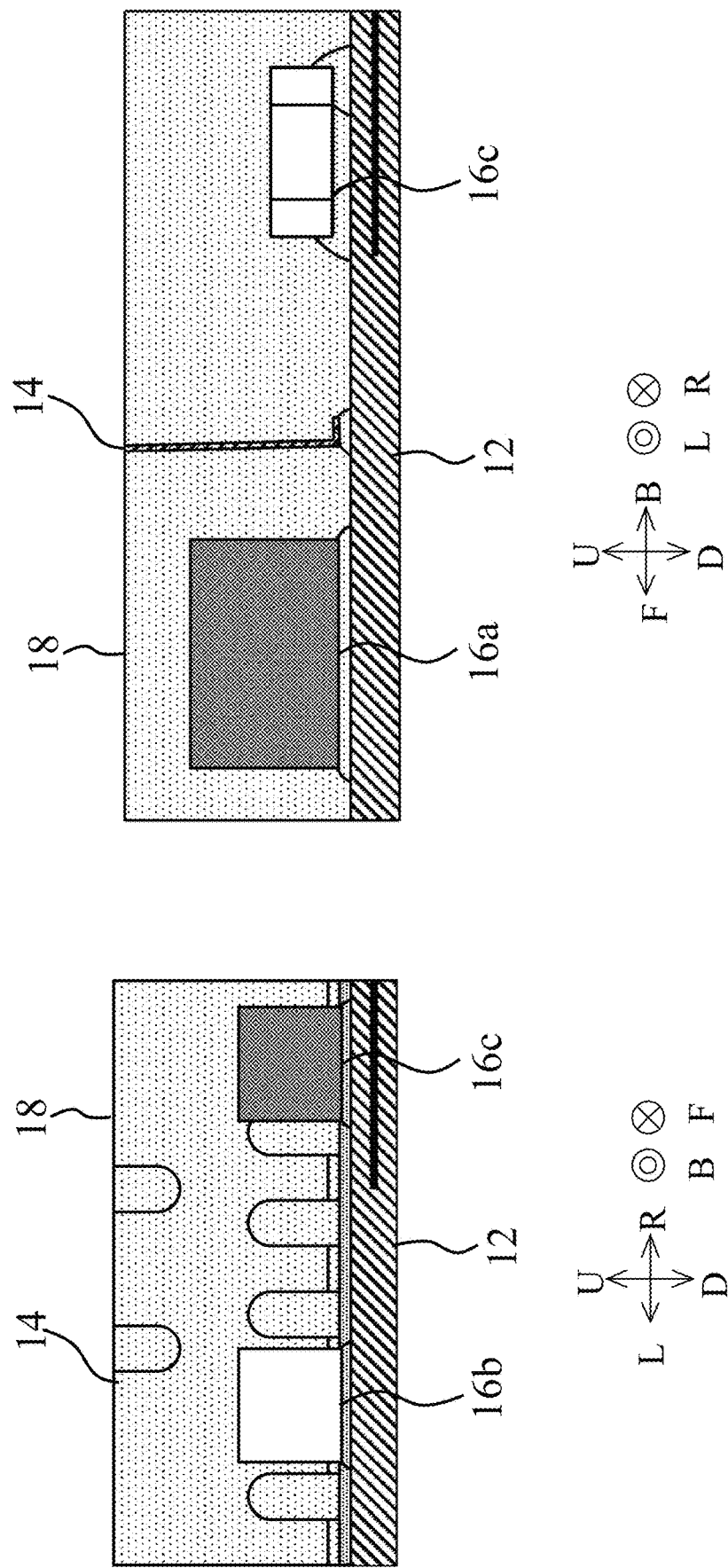
FIG. 11 is a cross-sectional view at the time of manufacturing the module 10.

Next, a method of manufacturing the module 10 will be described with reference to the drawings. FIG. 9 is a perspective view at the time of mounting the metal member 14. FIGS. 10 and 11 are cross-sectional views at the time of manufacturing the module 10. FIG. 12 is a photograph of an upper surface SU1 of a sealing resin layer 18 immediately after the sealing resin layer 18 is ground.

First, the electronic components 16a to 16c are mounted on the upper main surface SU2 of the substrate 12. Further, as illustrated in FIG. 9, the metal member 14 is mounted on the substrate 12. Here, the metal member 14 at the time of manufacturing the module 10 will be described. The metal member 14 further includes a top surface portion 148. The top surface portion 148 is located between the upper notch 142a and the upper notch 142b in the left-right direction when viewed in the front-back direction. The top surface portion 148 extends backward from the upper side LU (see FIG. 4). The top surface portion 148 is formed by bending a part of the metal member 14 backward. The top surface portion 148 is used for mounting the metal member 14. Specifically, the top surface portion 148 is sucked using a mounting machine. Then, the metal member 14 is moved by the mounting machine, and the foot portions 146a to 146g are set on the mounting electrode 122. Thereafter, each of the foot portions 146a to 146g is fixed to the mounting electrode 122 by the solders 200a to 200g. At this time, solder is applied to each of the foot portions 146a to 146g, and solder is also applied to the mounting electrode 122. In order to further stabilize the ground potential, the solders 200a to 200g applied to the adjacent foot portions 146a to 146g may be integrated. In FIG. 4, the solders 200a to 200g applied to the foot portions 146a to 146g are integrated. Thus, the foot portions 146a to 146g are fixed to the mounting electrode 122 which is one electrode by integrated solder.

Next, as illustrated in FIG. 10, the sealing resin layer 18 is formed on the upper main surface SU2 of the substrate 12. At this time, the sealing resin layer 18 is formed so that the sealing resin layer 18 covers the entire upper main surface SU2 of the substrate 12. Specifically, the substrate 12 is set in a mold. Then, a resin (molten resin) which is melted is injected into the mold. At this time, the molten resin passes through the upper notches 142a and 142b and the lower notches 144a to 144f and spreads over the entire upper main surface SU2 of the substrate 12. Then, the electronic components 16a to 16c and the metal member 14 are located in the sealing resin layer 18. That is, the electronic components 16a to 16c and the metal member 14 are not exposed from the sealing resin layer 18.

Next, the upper surface SU1 of the sealing resin layer 18 is ground with a grindstone. For example, the grindstone grinds the upper surface SU1 of the sealing resin layer 18 while moving backward with respect to the upper surface SU1 of the sealing resin layer 18. Thus, the upper end of the plate-shaped portion 140 is exposed from the upper surface SU1 of the sealing resin layer 18. When the upper surface SU1 of the sealing resin layer 18 is ground, the top surface portion 148 of the metal member 14 is ground. At this time, as illustrated in FIG. 12, a protruding portion 160 is formed at the upper end of the plate-shaped portion 140. Specifically, the sealing resin layer 18 is ground while the grindstone is moved backward with respect to the sealing resin layer 18. Thus, the protruding portion 160 extends backward from the upper end of the plate-shaped portion 140. The thickness of the protruding portion 160 is much smaller than the thickness of the plate-shaped portion 140. The upper end of the metal member 14 is scraped by a grindstone. Therefore, the surface roughness of the upper end of the plate-shaped portion 140 is larger than the surface roughness of the front main surface SF3 and the back main surface SB3 of the plate-shaped portion 140.

Further, by cutting the substrate 12 and the sealing resin layer 18 in the up-down direction using a dicer, the substrate 12 and the sealing resin layer 18 are divided. At this time, the left surface SL1, the right surface SR1, the front surface SF1, and the back surface SB1 of the sealing resin layer 18 are formed. The left end and the right end of the plate-shaped portion 140 are exposed from the left surface SL1 and the right surface SR1 of the sealing resin layer 18. The surface roughness of the left end and the right end of the plate-shaped portion 140 is larger than the surface roughness of the front main surface SF3 and the back main surface SB3 of the plate-shaped portion 140. Protruding portions are also formed at the left end and the right end of the plate-shaped portion 140 in the same manner as the upper end of the plate-shaped portion 140.

Next, the shield 20 is formed on the upper surface SU1, the left surface SL1, the right surface SR1, the front surface SF1, and the back surface SB1 of the sealing resin layer 18. Specifically, the adhesion layer, the conductive layer, and the protective layer are formed by performing sputtering three times. As described above, the surface roughness of the upper end, the left end, and the right end of the metal member 14 is larger than the surface roughness of the front main surface SF3 and the back main surface SB3 of the plate-shaped portion 140. Therefore, the adhesion layer adheres to the upper end, the left end, and the right end of the metal member 14 with high adhesion strength. Through the above steps, the module 10 is completed.

[Effects]

According to the module 10, it is possible to suppress the metal member 14 from falling down at the time of forming the sealing resin layer 18. More specifically, the foot portions 146a to 146g extend backward from the lower side LD. In this case, the outer surface SO of the portion where the metal member 14 is bent is connected to the front main surface SF3. On the first main surface S1 and the second main surface S2, slight unevenness is formed by a plurality of lines. When the metal member 14 is bent to form the foot portions 146a to 146g, the plurality of lines formed on the outer surface SO of the portion where the metal member 14 is bent are extended in the width direction of the lines. Therefore, the depth of the plurality of lines formed on the outer surface SO of the portion where the metal member 14 is bent becomes shallow. As a result, the surface roughness of the outer surface SO of the portion where the metal member 14 is bent is smaller than the surface roughness of the front main surface SF3. Thus, the solders 200a to 200g easily wet upward on the outer surface SO. As a result, the metal member 14 is suppressed from falling down at the time of forming the sealing resin layer 18.

According to the module 10, it may be possible to suppress the metal member 14 from falling down at the time of forming the sealing resin layer 18 also for the following reasons. Specifically, an oxide film may be formed on the surface of the metal member 14. In such a case, the oxide film formed on the outer surface SO is damaged by the bending of the metal member 14. Thus, tough pitch copper, brass, phosphor bronze, SUS, aluminum, and the like are exposed on the outer surface SO. The wettability of the solders 200a to 200g to tough pitch copper, brass, phosphor bronze, SUS, aluminum, or the like is higher than the wettability of the solders 200a to 200g to an oxide film. Therefore, the solders 200a to 200g wet more upward on the outer surface SO. As a result, the metal member 14 is suppressed from falling down at the time of forming the sealing resin layer 18.

According to the module 10, when the plate-shaped portion 140 is inclined at the time of forming the sealing resin layer 18, the area of the portion where the foot portions 146a to 146g are peeled off from the mounting electrode 122 is reduced. More specifically, in the module according to the reference example, the plurality of foot portions include a front foot portion extending forward from the lower side of the plate-shaped portion and a back foot portion extending backward from the lower side of the plate-shaped portion. In the module according to the reference example, the length in the front-back direction of the portion where the metal member is fixed to the mounting electrode is the sum of the length in the front-back direction of the front foot portion and the length in the front-back direction of the back foot portion. For example, when the plate-shaped portion falls backward so as to rotate about the back end of the back foot portion, the front foot portion and the back foot portion may be peeled off from the mounting electrode over the total length of the length of the front foot portion in the front-back direction and the length of the back foot portion in the front-back direction.

On the other hand, in the module 10, all of the foot portions 146a to 146g extend backward from the lower side LD of the plate-shaped portion 140. Therefore, in the module 10, the length in the front-back direction of the portion where the metal member 14 is fixed to the mounting electrode 122 is the length in the front-back direction of the foot portions 146a to 146g. Therefore, for example, when the plate-shaped portion 140 falls backward so as to rotate about the back ends of the foot portions 146a to 146g, there is a possibility that the foot portions 146a to 146g are peeled off from the mounting electrode 122 over the length of the foot portions 146a to 146g in the front-back direction. The lengths of the foot portions 146a to 146g in the front-back direction are shorter than the sum of the length of the front foot portion in the front-back direction and the length of the back foot portion in the front-back direction of the module according to the reference example. Therefore, according to the module 10, when the plate-shaped portion 140 is inclined at the time of forming the sealing resin layer 18, the area of the portion where the foot portions 146a to 146g are peeled off from the mounting electrode 122 is reduced.

In the module 10, a crack is formed on the outer surface SO of the bent portion of the metal member 14 as illustrated in FIG. 8. As a result, the solders 200a to 200g enters the crack. An anchor effect occurs between the solders 200a to 200g and the outer surface SO. Therefore, the solders 200a to 200g and the outer surface SO are firmly adhered to each other. As described above, the metal member 14 is more firmly fixed to the mounting electrode 122.

In the module 10, the metal member 14 and the shield 20 can be more reliably connected. Hereinafter, a module in which the plate-shaped portion is not inclined with respect to the up-down direction is defined as a module according to a comparative example. In the module according to the comparative example, the upper surface of the sealing resin layer is polished. After the sealing resin layer is polished, the upper end of the plate-shaped portion is a plane orthogonal to the front main surface and the back main surface of the plate-shaped portion.

On the other hand, the plate-shaped portion 140 is inclined with respect to the up-down direction such that an upper end of the plate-shaped portion 140 is located in front of a lower end of the plate-shaped portion 140. In the module 10, the upper surface SU1 of the sealing resin layer 18 is polished. After polishing the sealing resin layer 18, the upper end of the plate-shaped portion 140 is a plane that forms an acute angle with respect to the front main surface SF3 of the plate-shaped portion 140 and an obtuse angle with respect to the back main surface SB3. Therefore, the area of the upper end of the plate-shaped portion 140 of the module 10 is larger than the area of the upper end of the plate-shaped portion of the module according to the comparative example. As a result, in the module 10, the upper end of the plate-shaped portion 140 comes into close contact with the shield 20. As described above, in the module 10, the metal member 14 and the shield 20 can be more reliably connected.

According to the module 10, it becomes easy to appropriately arrange the electronic components 16a to 16c according to the characteristics of the electronic components 16a to 16c. More specifically, the electronic components 16a to 16c may generate a magnetic flux like a coil, for example. When the electronic components 16a to 16c generate a magnetic flux, there are the following two cases. The first case is a case in which the magnetic flux generated by an electronic component is shielded in order to suppress an influence of the magnetic flux on surrounding electronic components. The electronic component corresponding to the first case is, for example, a surface acoustic wave (SAW) filter, a low noise amplifier (LNA), a switch, or the like. The second case is a case in which the magnetic flux generated by the electronic component is not shielded so that the characteristics of the electronic component are not deteriorated. The electronic component corresponding to the second case is, for example, a chip inductor. Therefore, in the module 10, the plate-shaped portion 140 is slightly inclined forward with respect to the up-down direction. Therefore, the plate-shaped portion 140 falls in a direction approaching the electronic component 16a. Thus, when the electronic component 16a generates a magnetic flux, the magnetic flux is easily shielded by the plate-shaped portion 140. On the other hand, the plate-shaped portion 140 falls in a direction away from the electronic components 16b and 16c. Thus, when the electronic components 16b and 16c generate a magnetic flux, the magnetic flux is less likely to be shielded by the plate-shaped portion 140. As described above, according to the module 10, the electronic component corresponding to the first case is disposed in front of the metal member 14. The electronic component corresponding to the second case is disposed behind the metal member 14. As a result, it becomes easy to appropriately arrange the electronic components 16a to 16c according to the characteristics of the electronic components 16a to 16c.

In addition, electronic components corresponding to the second case include a vertical inductor and a horizontal inductor. The vertical inductor is an inductor whose winding axis extends in the up-down direction. In a case where the electronic component corresponding to the second case is a vertical inductor, it is possible to prevent the metal member 14 from hindering the magnetic flux generated by the vertical inductor, and it is possible to arrange the vertical inductor close to the metal member 14. That is, the degree of freedom in arrangement of the vertical-type electronic component is increased. The horizontal inductor is an inductor in which a winding axis extends in a direction orthogonal to the up-down direction. In a case where the electronic component corresponding to the second case is a horizontal inductor, the distance between the plate-shaped portion 140 and the horizontal inductor when the plate-shaped portion 140 is inclined forward with respect to the up-down direction is longer than the distance between the plate-shaped portion 140 and the horizontal inductor when the plate-shaped portion 140 extends in the up-down direction. As a result, it is possible to suppress deterioration of the characteristics of the horizontal inductor.

In the module 10, the plate-shaped portion 140 is slightly inclined forward with respect to the up-down direction. Thus, the pressure due to the molten resin applied to the plate-shaped portion 140 is reduced. As a result, generation of cracks between the foot portions 146a to 146g and the solders 200a to 200g and breakage of the foot portions 146a to 146g and the solders 200a to 200g are suppressed.

In the module 10, voids generated in the solders 200a to 200g are easily released backward from the solders 200a to 200g. More specifically, all of the foot portions 146a to 146g extend backward from the lower side LD, and are inclined with respect to the front-back direction such that the back ends of the foot portions 146a to 146g are located above the front ends of the foot portions 146a to 146g. That is, as illustrated in FIG. 6, the foot portions 146a to 146g extend from the lower end portion of the plate-shaped portion 140 toward the rear upper direction. Therefore, the interval in the up-down direction between a lower surface Sx of each of the foot portions 146a to 146g and an upper surface Sy of the mounting electrode 122 increases toward the front. Each of the solders 200a to 200g is provided between the lower surface Sx of the foot portions 146a to 146g and the upper surface Sy of the mounting electrode 122. As described above, since the interval in the up-down direction between the lower surfaces Sx of the foot portions 146a to 146g and the upper surface Sy of the mounting electrode 122 becomes larger toward the rear, voids generated in the solders 200a to 200g are easily discharged backward from the solders 200a to 200g.

In the module 10, a portion where the metal member 14 is fixed to the mounting electrode 122 by the solders 200a to 200g is widened. More specifically, the plate-shaped portion 140 is inclined with respect to the up-down direction such that the upper end of the plate-shaped portion 140 is located in front of the lower end of the plate-shaped portion 140. Further, all of the foot portions 146a to 146g extend backward from the lower side LD, and are inclined with respect to the front-back direction such that the back ends of the foot portions 146a to 146g are located above the front ends of the foot portions 146a to 146g. That is, as illustrated in FIG. 6, the foot portions 146a to 146g are slightly inclined upward with respect to the front-back direction. Therefore, in the metal member 14, a portion located within a distance where the solders 200a to 200g can wet and spread from the mounting electrode 122 is widened. That is, a portion of the metal member 14 close to the mounting electrode 122 is widened. As a result, a portion where the metal member 14 is fixed to the mounting electrode 122 by the solders 200a to 200g is widened.

According to the module 10, it is possible to suppress the metal member 14 from falling down at the time of forming the sealing resin layer 18. More specifically, the plate-shaped portion 140 is provided with the upper notches 142a and 142b extending downward from the upper side LU. The plate-shaped portion 140 is provided with one or more lower notches 144a to 144f extending upward from the lower side LD. Thus, at the time of forming the sealing resin layer 18, the molten resin passes through the upper notches 142a and 142b and the lower notches 144a to 144f and spreads over the entire upper main surface SU2 of the substrate 12. Therefore, the vicinity of the upper side LU and the vicinity of the lower side LD of the plate-shaped portion 140 are less likely to receive the pressure due to the molten resin. This prevents the plate-shaped portion 140 from falling so as to rotate about the upper side LU or the plate-shaped portion 140 from falling so as to rotate about the lower side LD. As a result, according to the module 10, it is possible to suppress the metal member 14 from falling down at the time of forming the sealing resin layer 18.

According to the module 10, the foot portions 146a to 146g can be accurately formed such that the angles of the foot portions 146a to 146g with respect to the plate-shaped portion 140 become values close to design values. Hereinafter, as illustrated in FIGS. 5 and 6, a boundary portion between the plate-shaped portion 140 and the foot portions 146a to 146g is defined as a boundary C. The foot portions 146a to 146g are formed by bending a part of the metal member 14. At this time, tensile stress is generated on the outer surface SO. Therefore, the outer surface SO is pulled. On the other hand, compressive stress is generated on the inner surface SI. The inner surface SI is compressed. In the inner surface SI, the metal material having lost a place to go due to the compressive stress is displaced leftward and rightward. Therefore, at the left end of the boundary C, the metal material protrudes leftward from the foot portions 146a to 146g. At the right end of the boundary C, the metal material protrudes rightward from the foot portions 146a to 146g. Therefore, the outer edges of the foot portions 146a to 146g are connected to the outer edges of the lower notches 144a to 144g. Therefore, the metal material can protrude into the lower notches 144a to 144f. In this case, the protrusion of the metal material is hardly hindered. Therefore, bending of a part of the metal member 14 for forming the foot portions 146a to 146g is hardly hindered. As a result, the foot portions 146a to 146g can be accurately formed such that the angles of the foot portions 146a to 146g with respect to the plate-shaped portion 140 become values close to design values. Therefore, the solder uniformly adheres to the entire lower surface Sx of the foot portions 146a to 146g. Thus, according to the module 10, self-standing of the metal member 14 is improved. The self-standing of the metal member 14 means that when the metal member 14 is fixed by solder, the metal member 14 is less likely to fall down even if the solder melts.

According to the module 10, the foot portions 146b to 146f can be accurately formed such that the angles of the foot portions 146b to 146f with respect to the plate-shaped portion 140 become values close to design values. More specifically, the foot portions 146a to 146g include the foot portions 146b to 146f (first foot portions) located between the lower notches 144a to 144f in the left-right direction when viewed in the front-back direction. The lower notches 144a to 144f are located on both the left and right of the foot portions 146b to 146f. Thus, the protrusion of the metal material is less likely to be hindered. Therefore, bending of a part of the metal member 14 for forming the foot portions 146b to 146f is less likely to be hindered. As a result, the foot portions 146b to 146f can be accurately formed such that the angles of the foot portions 146b to 146f with respect to the plate-shaped portion 140 become values close to design values. Therefore, the solder uniformly adheres to the entire lower surface Sx of the foot portions 146b to 146f. Thus, according to the module 10, self-standing of the metal member 14 is improved.

According to the module 10, the foot portions 146a and 146g can be accurately formed such that the angles of the foot portions 146a and 146g with respect to the plate-shaped portion 140 become values close to design values. More specifically, the foot portions 146a to 146g include the foot portions 146a and 146g disposed at the left end portion and the right end portion of the lower side LD when viewed in the front-back direction. There is no metal material on the left of the foot portion 146a. The metal material is not present on the right of the foot portion 146g. Thus, bending of a part of the metal member 14 for forming the foot portions 146a and 146g is less likely to be hindered. As a result, the foot portions 146a and 146g can be accurately formed such that the angles of the foot portions 146a and 146g with respect to the plate-shaped portion 140 become values close to design values. Therefore, the solder uniformly adheres to the entire lower surfaces Sx of the foot portions 146a and 146g. Thus, according to the module 10, self-standing of the metal member 14 is improved.

According to the module 10, the region where the electronic components 16a to 16c can be mounted on the upper main surface SU2 of the substrate 12 increases. Hereinafter, a module according to a reference example will be described as an example. The metal member of the module according to the reference example includes a plurality of foot portions. The plurality of foot portions include a front foot portion extending forward from the lower side of the plate-shaped portion and a back foot portion extending backward from the lower side of the plate-shaped portion. When the electronic component is mounted in front of the metal member, the electronic component needs to be mounted at a position away forward from the front foot portion by a predetermined distance. Therefore, the electronic component cannot be mounted in the region from the metal member to the total distance of the length of the front foot portion and a predetermined distance. Similarly, when the electronic component is mounted behind the metal member, the electronic component needs to be mounted at a position away backward from the back foot portion by a predetermined distance. Therefore, the electronic component cannot be mounted in the region from the metal member to the total distance of the length of the back foot portion and the predetermined distance.

On the other hand, in the module 10, the foot portions 146a to 146g extend backward from the lower side LD of the plate-shaped portion 140. In this case, when the electronic components 16b and 16c are mounted behind the metal member 14, the electronic components 16b and 16c need to be mounted at positions away backward from the foot portions 146a to 146g by a predetermined distance. Therefore, the electronic components 16b and 16c cannot be mounted in the region from the metal member 14 to the total distance of the lengths of the foot portions 146a to 146g and the predetermined distance. On the other hand, when the electronic component 16a is mounted in front of the metal member 14, the electronic component needs to be mounted at a position away forward from the plate-shaped portion 140 by a predetermined distance. Therefore, the electronic component 16a cannot be mounted in a region up to a predetermined distance from the metal member 14. Therefore, in the module according to the reference example, the region where the electronic component cannot be mounted is wider than the region where the electronic components 16a to 16c cannot be mounted in the module 10 by only the region from the metal member to the length of the front foot portion. In other words, according to the module 10, the region where the electronic components 16a to 16c can be mounted on the upper main surface SU2 of the substrate 12 increases.

In addition, according to the module 10, the wetting-up states of solders 200a to 200g with respect to the foot portions 146a to 146g become nearly uniform. More specifically, the metal member 14 is generally formed by punching a metal plate. At this time, the outer edge of the metal member 14 is formed such that the shear surface and the fracture surface are adjacent to each other in the thickness direction of the metal member 14. In the module 10, the foot portions 146a to 146g extend backward from the lower side LD of the plate-shaped portion 140. Therefore, at the back ends of the foot portions 146a to 146g, the positional relationship between the shear surface and the fracture surface in the up-down direction is aligned. Thus, the wetting-up states of the solders 200a to 200g with respect to the foot portions 146a to 146g approach uniformity.

According to the module 10, the potential of the metal member 14 tends to be uniform. More specifically, the foot portions 146a to 146g are arranged at equal intervals in the left-right direction when viewed in the front-back direction. The foot portions 146a to 146g are connected to the ground potential via the mounting electrode 122. Thus, the metal member 14 is connected to the ground potential at portions arranged at equal intervals in the left-right direction when viewed in the front-back direction. As a result, according to the module 10, the potential of the metal member 14 tends to be uniform.

According to the module 10, the self-alignment property of the foot portions 146a to 146g is improved according to the metal member 14. More specifically, the foot portions 146a to 146g are arranged at equal intervals in the left-right direction when viewed in the front-back direction. Thus, when the solder melts in the mounting of the metal member 14, the solder attached to the foot portions 146a to 146g has a symmetrical structure. When solder is melted in mounting of the metal member 14, self-standing of the metal member 14 is secured. As a result, according to the metal member 14, the self-alignment property of the foot portions 146a to 146g is improved. The self-alignment property means that when solder is melted in mounting of the metal member 14, the foot portions 146a to 146g are maintained in an appropriate posture by surface tension of the solders 200a to 200g.

According to the module 10, it is possible to suppress the metal member 14 from falling down at the time of forming the sealing resin layer 18. More specifically, in the module 10, the lower notches 144a to 144f are arranged at equal intervals in the left-right direction when viewed in the front-back direction. Thus, the vicinity of the lower side LD of the plate-shaped portion 140 receives equal pressure from the molten resin. As a result, the plate-shaped portion 140 is suppressed from falling due to application of a large pressure to a specific portion in the vicinity of the lower side LD of the plate-shaped portion 140.

According to the module 10, the metal member 14 can be easily processed. More specifically, the shortest distance between the upper notches 142a and 142b and the lower notches 144a to 144f is 1.5 times or more the plate thickness of the plate-shaped portion 140. Thus, the upper notches 142a and 142b and the lower notches 144a to 144f are not too close to each other. As a result, punching of the metal member 14 is facilitated.

According to the module 10, the foot portions 146a to 146g and the top surface portion 148 can be accurately formed. More specifically, the foot portions 146a to 146g are formed by bending a part of the metal member 14 backward. The top surface portion 148 is formed by bending a part of the metal member 14 backward. In this manner, the foot portions 146a to 146g and the top surface portion 148 are formed by bending a part of the metal member 14 in the same direction. Therefore, it is possible to simultaneously form the foot portions 146a to 146g and the top surface portion 148. As a result, the foot portions 146a to 146g and the top surface portion 148 can be formed with high accuracy.

According to the module 10, it is possible to suppress the metal member 14 from falling down at the time of forming the sealing resin layer 18. More specifically, the plate-shaped portion 140 is provided with upper notches 142a and 142b. The metal member 14 includes foot portions 146a to 146g. As a result, in the vicinity of the upper side LU of the metal member 14, the pressure due to the molten resin is reduced by the upper notches 142a and 142b. On the other hand, the vicinity of the lower side LD of the metal member 14 is opposed to the pressure due to the molten resin by the foot portions 146a to 146g. As described above, in the module 10, measures against the pressure due to the molten resin are taken in the vicinity of the upper side LU and the vicinity of the lower side LD of the metal member 14. As a result, according to the module 10, it is possible to suppress the metal member 14 from falling down at the time of forming the sealing resin layer 18.

According to the module 10, it is possible to suppress the metal member 14 from falling down at the time of forming the sealing resin layer 18. More specifically, the metal member 14 includes the foot portions 146a to 146g. The foot portions 146a to 146g are fixed to the mounting electrode 122. Therefore, the lower part of the metal member 14 is less likely to be elastically deformed than the upper part of the metal member 14. When the molten resin applies pressure on the plate-shaped portion 140, the lower part of the metal member 14 is hardly elastically deformed, so that the lower part of the metal member 14 cannot release the pressure due to the molten resin. Therefore, a large pressure is likely to be applied to the lower part of the metal member 14. In this case, there is a possibility that the foot portions 146a to 146g are peeled off from the mounting electrode 122 and the metal member 14 falls down. Therefore, the plate-shaped portion 140 is provided with the lower notches 144a to 144f. Thus, a large pressure applied to the metal member 14 can be released by the lower notches 144a to 144f. That is, application of a large pressure to the lower part of the metal member 14 is suppressed. Therefore, it is possible to suppress the metal member 14 from falling down at the time of forming the sealing resin layer 18.

In addition, since the upper notches 142a and 142b are provided in the plate-shaped portion 140, the total length of the upper ends of the metal member 14b in the left-right direction is short. Therefore, when the upper surface SU1 of the sealing resin layer 18 is ground, the amount of grinding the metal member 14 is reduced. As a result, deterioration of the grindstone is suppressed.

In the module 10, since the area of the mounting electrode 122 is large, the solders 200a to 200g on the mounting electrode 122 are located on the front, back, left, and right of the foot portions 146a to 146g. Thus, the solders 200a to 200g are easily wetted upward on the side surfaces of the foot portions 146a to 146g.

In the module 10, formation of a void under the outer surface SO is suppressed. More specifically, the space below the outer surface SO is a space into which the molten resin is less likely to enter. Therefore, the solders 200a to 200g wet upward to the vicinity of the upper end of the outer surface SO. Thus, there is no void under the outer surface SO at the time of forming the sealing resin layer 18. As a result, in the module 10, formation of a void under the outer surface SO is suppressed. By suppressing the formation of the void, the connection reliability between the metal member 14 and the mounting electrode 122 is improved.

In the module 10, generation of voids in the solders 200a to 200g is suppressed. Shear surfaces and fracture surfaces are formed at the back end portions of the foot portions 146a to 146g. The surface roughness of the fracture surface is larger than the surface roughness of the shear surface. Therefore, adhesion of the solders 200a to 200g to the fracture surface causes generation of voids. Therefore, as illustrated in FIG. 6, the back end portions of the foot portions 146a to 146g have a shape in which the upper end and the lower end protrude backward from the center. Thus, the solders 200a to 200g are less likely to wet upward at the back end portions of the foot portions 146a to 146g. As a result, in the module 10, generation of voids in the solders 200a to 200g is suppressed.

In the module 10, the protruding portion 160 extends backward from the upper end of the plate-shaped portion 140. Therefore, the protruding portion 160 extends from the plate-shaped portion 140 so as to approach the electronic components 16b and 16c. The protruding portion 160 shields the electronic components 16b and 16c. As a result, the module 10 has a high shielding property with respect to the electronic components 16b and 16c.

In the module 10, the protruding portion 160 extends backward from the upper end of the plate-shaped portion 140. Thus, the protruding portion 160 is also used for connecting the metal member 14 and the shield 20. Therefore, the metal member 14 and the shield 20 are more reliably connected.

In the module 10, the protruding portion 160 extends backward from the upper end of the plate-shaped portion 140. This makes it easy to visually recognize the upper end of the plate-shaped portion 140. Therefore, it is possible to determine whether the module 10 is a good product or a defective product before forming the shield 20.

In the module 10, the washing property of the flux is improved. More specifically, after the metal member 14 is mounted on the mounting electrode 122, the substrate 12 and the metal member 14 are immersed in a tank containing a flux cleaning solution. Thus, the flux is washed. At this time, in order to improve the washing property of the flux, it is preferable that the fluidity of the flux cleaning solution is high. Therefore, the upper notches 142a and 142b and the lower notches 144a to 144g are provided in the plate-shaped portion 140. Thus, the flux cleaning solution can pass through the upper notches 142a and 142b and the lower notches 144a to 144g. Therefore, the fluidity of the flux cleaning solution is improved. As a result, in the module 10, the washing property of the flux is improved. Further, the flux cleaning solution remaining at the bent portion of the top surface portion 148 flows out from the bent portion of the top surface portion 148 through the upper notches 142a and 142b.

(First Modification)

Hereinafter, a metal member 14a according to a first modification will be described with reference to the drawings. FIG. 13 is a rear view of a metal member 14a according to a first modification.

The metal member 14a differs from the metal member 14 in the number of lower notches. Specifically, in the metal member 14, the plate-shaped portion 140 is provided with six lower notches 144a to 144f. On the other hand, in the metal member 14a, the plate-shaped portion 140 is provided with four lower notches 144b to 144e. Since other structures of the metal member 14a are the same as those of the metal member 14, the description thereof will be omitted.

(Second Modification)

Hereinafter, a metal member 14b according to a second modification will be described with reference to the drawings. FIG. 14 is a rear view of a metal member 14b according to a second modification.

The metal member 14b is different from the metal member 14a in the number of lower notches. Specifically, in the metal member 14a, the plate-shaped portion 140 is provided with four lower notches 144b to 144e. On the other hand, in the metal member 14b, the plate-shaped portion 140 is provided with six lower notches 144a to 144f.

The lower notches 144a to 144f include the lower notch 144a (first lower notch) disposed at the left end portion of the lower side LD when viewed in the front-back direction. The lower notch 144a is an L-shaped defect formed by removing the lower left corner of the rectangular plate-shaped portion 140. Therefore, the lower notch 144a has the same shape as the right half of the lower notches 144b to 144e. However, the lower notch 144a may have a shape different from the right half of the lower notches 144b to 144e.

The lower notches 144a to 144f include the lower notch 144f (first lower notch) disposed at the right end portion of the lower side LD when viewed in the front-back direction. The lower notch 144f is an L-shaped defect formed by removing the lower right corner of the rectangular plate-shaped portion 140. Therefore, the lower notch 144f has the same shape as the left half of the lower notches 144b to 144e. However, the lower notch 144f may have a shape different from the left half of the lower notches 144b to 144e. Since other structures of the metal member 14b are the same as those of the metal member 14a, the description thereof will be omitted.

In the metal member 14b, since the lower notch 144a is provided, the length of the left end of the metal member 14b in the up-down direction is short. Therefore, when the left surface SL1 of the sealing resin layer 18 is cut, the amount of cutting the metal member 14b is reduced. As a result, deterioration of the blade of the dicer is suppressed. In the metal member 14b, since the lower notch 144f is provided, the length of the right end of the metal member 14b in the up-down direction is short. Therefore, when the right surface SR1 of the sealing resin layer 18 is cut, the amount of cutting the metal member 14b is reduced. As a result, deterioration of the blade of the dicer is suppressed.

(Third Modification)

Figure 15:
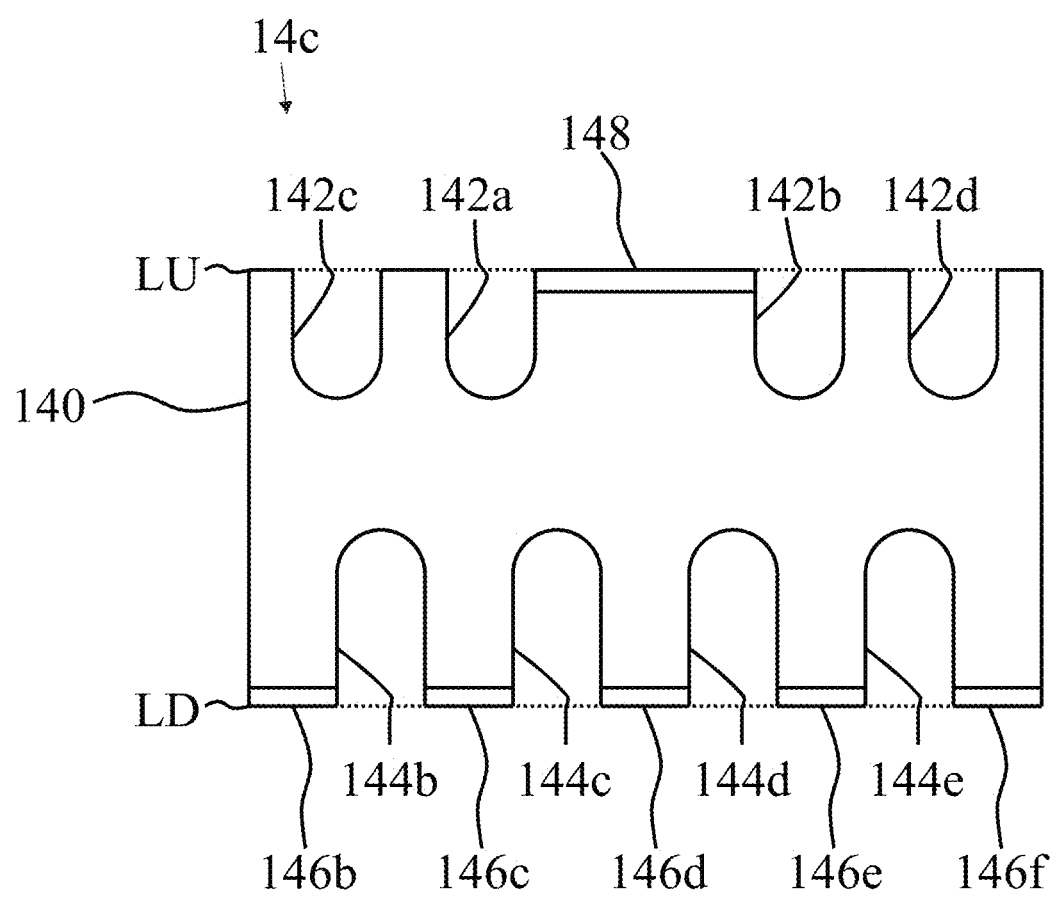
FIG. 15 is a rear view of a metal member 14c according to a third modification.

Hereinafter, a metal member 14c according to a third modification will be described with reference to the drawings. FIG. 15 is a rear view of a metal member 14c according to a third modification.

The metal member 14c is different from the metal member 14a in the number of upper notches. Specifically, in the metal member 14a, the plate-shaped portion 140 is provided with two upper notches 142a and 142b. On the other hand, in the metal member 14c, the plate-shaped portion 140 is provided with four upper notches 142a to 142d. The upper notch 142c is located on the left of the upper notch 142a when viewed in the front-back direction. The upper notch 142d is located to the right of the upper notch 142b when viewed in the front-back direction. Since other structures of the metal member 14c are the same as that of the metal member 14a, the description thereof will be omitted.

According to the metal member 14c, the upper notches 142c and 142d are provided in the plate-shaped portion 140. Thus, the vicinity of the upper side LU of the plate-shaped portion 140 is less likely to receive the pressure due to the molten resin. As a result, it is possible to suppress the metal member 14c from falling down at the time of forming the sealing resin layer 18. In addition, for the same reason as the metal member 14b, deterioration of the blade of the dicer is suppressed.

(Fourth Modification)

Hereinafter, a metal member 14d according to a fourth modification will be described with reference to the drawings. FIG. 16 is a rear view of a metal member 14d according to a fourth modification.

The metal member 14d is different from the metal member 14a in the number of lower notches and the number of foot portions. Specifically, in the metal member 14a, the plate-shaped portion 140 is provided with four lower notches 144b to 144e. On the other hand, in the metal member 14d, the plate-shaped portion 140 is provided with two lower notches 144b and 144e. The upper notches 142a and 142b are disposed between the lower notches 144b and 144e in the left-right direction when viewed in the front-back direction.

The metal member 14a includes five foot portions 146b to 146f. On the other hand, the metal member 14d includes two foot portions 146b and 146f. The foot portion 146b is located on the left of the lower notch 144b. The foot portion 146f is located on the right of the lower notch 144e. Thus, the foot portion is not disposed between the lower notch 144b and the lower notch 144e in the left-right direction when viewed in the front-back direction. The structure of the other metal member 14d is the same as that of the metal member 14a, and thus the description thereof will be omitted.

According to the metal member 14d, the foot portion is not disposed between the lower notch 144b and the lower notch 144e in the left-right direction when viewed in the front-back direction. Therefore, when viewed in the front-back direction, the electronic component can be disposed near the plate-shaped portion 140 between the lower notch 144b and the lower notch 144e in the left-right direction. In addition, since the area of the metal member 14d is increased, the shielding property between the electronic component 16a and the electronic components 16b and 16c is improved. Thus, the electronic component 16a and the electronic components 16b and 16c can be brought close to each other.

(Fifth Modification)

Hereinafter, a metal member 14e according to a fifth modification will be described with reference to the drawings. FIG. 17 is a rear view of a metal member 14e according to a fifth modification.

The metal member 14e is different from the metal member 14d in the number of upper notches. Specifically, in the metal member 14d, the plate-shaped portion 140 is provided with two upper notches 142a and 142b. On the other hand, in the metal member 14e, the plate-shaped portion 140 is provided with four upper notches 142a to 142d. Since other structures of the metal member 14e are the same as those of the metal member 14d, the description thereof will be omitted.

Sixth Modification)

Hereinafter, a metal member 14f according to a sixth modification will be described with reference to the drawings. FIG. 18 is a rear view of a metal member 14f according to a sixth modification.

The metal member 14f is different from the metal member 14a in that a lower notch 144x in which the lower notch 144c and the lower notch 144d are connected to each other is provided in the plate-shaped portion 140. Therefore, the metal member 14f does not include the foot portion 146d. In such a structure, the upper notches 142a and 142b and the lower notches 144b, 144e, and 144x are alternately arranged in the left-right direction. Thus, the upper notches 142a and 142b and the lower notches 144b, 144e, and 144x are less likely to be aligned in the up-down direction. As a result, the strength of the metal member 14f increases. In addition, when the upper notches 142a and 142b and the lower notches 144b, 144e, and 144x are alternately arranged in the left-right direction, the upper notches 142a and 142b and the lower notches 144b, 144e, and 144x are uniformly distributed over the entire plate-shaped portion 140. As a result, the molten resin easily passes through the upper notches 142a and 142b and the lower notches 144b, 144e, and 144x. As a result, the sealing resin layer 18 is easily formed.

(Seventh Modification)

Hereinafter, a metal member 14g according to a seventh modification will be described with reference to the drawings. FIG. 19 is a rear view of a metal member 14g according to a seventh modification.

The metal member 14g is different from the metal member 14a in that a lower notch 144y in which the lower notches 144b to 144e are connected to one is provided in the plate-shaped portion 140. Therefore, the metal member 14*f* does not include the foot portions 146*c* to 146*e*. The lower notch 144*y* is disposed between the foot portion 146*b* and the foot portion 146*f* in the left-right direction when viewed in the front-back direction.

According to the metal member 14*g*, the lower notch 144*y* is disposed between the foot portion 146*b* and the foot portion 146*f* in the left-right direction when viewed in the front-back direction. Therefore, the width of the lower notch 144*y* in the left-right direction is large. Therefore, the molten resin easily passes through the lower notch 144*y*. As a result, the sealing resin layer 18 is easily formed.

According to the metal member 14*g*, electronic components can be disposed as follows. More specifically, electronic components requiring shielding are disposed near the foot portions 146*b* and 146*f*. The electronic component is disposed so as to pass through the lower notch 144*y* in the front-back direction. That is, the metal member 14 and the electronic component overlap each other when viewed in the up-down direction. Thus, the distance between the metal member 14 and the electronic component can be eliminated.

(Eighth Modification)

Hereinafter, a metal member 14*h* according to an eighth modification will be described with reference to the drawings. FIG. 20 is a rear view of a metal member 14*h* according to an eighth modification.

The metal member 14*h* is different from the metal member 14*b* in the number of upper notches. In the metal member 14*b*, the plate-shaped portion 140 is provided with two upper notches 142*a* and 142*b*. On the other hand, in the metal member 14*h*, the plate-shaped portion 140 is provided with four upper notches 142*a* to 142*d*.

The upper notches 142*a* to 142*d* include the upper notches 142*c* and 142*d* (first upper notches) arranged at the left end portion or the right end portion of the upper side LU when viewed in the front-back direction. The upper notch 142*c* is an L-shaped defect formed by removing the upper left corner of the rectangular plate-shaped portion 140. Therefore, the upper notch 142*c* has the same shape as the right half of the upper notches 142*a* and 142*b*.

The upper notch 142*d* is an L-shaped defect formed by removing the upper right corner of the rectangular plate-shaped portion 140. Therefore, the upper notch 142*d* has the same shape as the left half of the upper notches 142*a* and 142*b*. Since other structures of the metal member 14*h* are the same as those of the metal member 14*b*, the description thereof will be omitted.

In the metal member 14*h*, since the upper notch 142*c* is provided, the length of the left end of the metal member 14*h* in the up-down direction is short. Therefore, when the left surface SL1 of the sealing resin layer 18 is cut, the amount of cutting the metal member 14*h* is reduced. As a result, deterioration of the blade of the dicer is suppressed. In the metal member 14*h*, since the upper notch 142*d* is provided, the length of the right end of the metal member 14*h* in the up-down direction is short. Therefore, when the right surface SR1 of the sealing resin layer 18 is cut, the amount of cutting the metal member 14*h* is reduced. As a result, deterioration of the blade of the dicer is suppressed.

In addition, in the metal member 14*h*, the metal member 14*h* can be suppressed from falling down. More specifically, the metal member 14*h* is provided with the upper notch 142*c* and the lower notch 144*a*. Similarly, the metal member 14*h* is provided with the upper notch 142*d* and the lower notch 144*f*. Thus, the difference between the pressure due to the molten resin received by the upper part of the plate-shaped portion 140 and the pressure due to the molten resin received by the lower part of the plate-shaped portion 140 is reduced. As a result, the metal member 14*h* can be suppressed from falling down.

(Ninth Modification)

Figure 21:
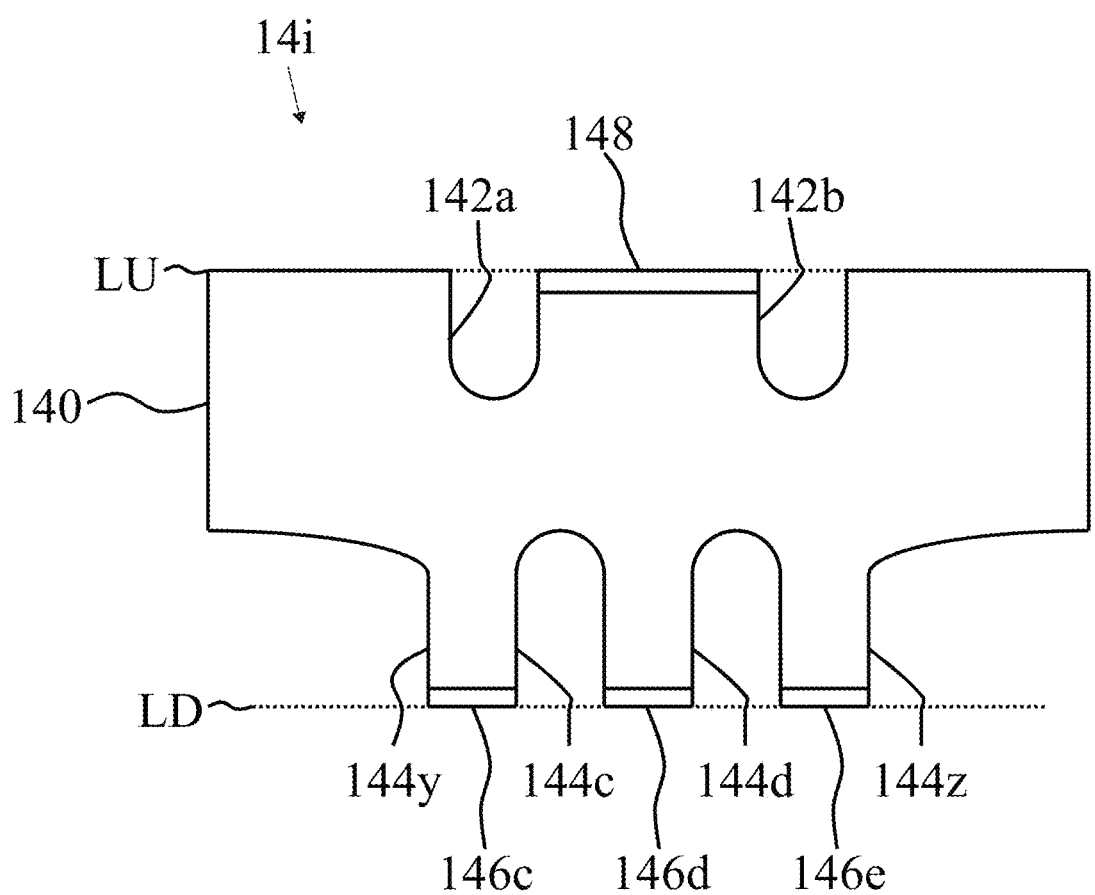
FIG. 21 is a rear view of a metal member 14i according to a ninth modification.

Hereinafter, a metal member 14*i* according to a ninth modification will be described with reference to the drawings. FIG. 21 is a rear view of a metal member 14*i* according to a ninth modification.

The metal member 14*i* is different from the metal member 14*b* in that the lower notch 144*y* in which the lower notch 144*a* and the lower notch 144*b* are connected to each other is provided in the plate-shaped portion 140, and a lower notch 144*z* in which the lower notch 144*e* and the lower notch 144*f* are connected to each other is provided in the plate-shaped portion 140. Therefore, the metal member 14*i* does not include the foot portions 146*b* and 146*f*. Therefore, the metal member 14*i* includes three foot portions 146*c*, 146*d*, and 146*e* disposed near the center of the plate-shaped portion 140 in the left-right direction.

(Tenth Modification)

Hereinafter, a metal member 14*j* according to a tenth modification will be described with reference to the drawings. FIG. 22 is a cross-sectional view of foot portions 146*a* to 146*g* of a metal member 14*j* according to a tenth modification.

The metal member 14*j* is different from the metal member 14 in including protrusions 150*a* to 150*g*. The protrusions 150*a* to 150*g* are provided so as to correspond to the foot portions 146*a* to 146*g*, respectively. The protrusions 150*a* to 150*g* are provided at the upper end of the outer surface SO. The protrusions 150*a* to 150*g* protrude forward from the front main surface SF3 of the plate-shaped portion 140. This prevents the solder from wetting upward too much. The overall structure of the metal member 14*k* is the same as the overall structure of any one of the metal members 14, and 14*a* to 14*i*.

According to the metal member 14*j*, the self-alignment property of the foot portions 146*a* to 146*g* is improved. More specifically, in the metal member 14*j*, the solders 200*a* to 200*g* are less likely to wet upward at the outer surface SO and the back end portions of the foot portions 146*a* to 146*g*. In this case, the foot portions 146*a* to 146*g* are fixed to the mounting electrode 122 only on the lower surfaces Sx of the foot portions 146*a* to 146*g* by the solders 200*a* to 200*g*. In this case, the self-alignment property of the foot portions 146*a* to 146*g* is improved.

(Eleventh Modification)

Hereinafter, a metal member 14*k* according to an eleventh modification will be described with reference to the drawings. FIG. 23 is a cross-sectional view of foot portions 146*a* to 146*g* of a metal member 14*k* according to an eleventh modification.

The metal member 14*k* is different from the metal member 14 in including recesses 152*a* to 152*g*. The recesses 152*a* to 152*g* is provided so as to respectively correspond to the foot portions 146*a* to 146*g*. The recesses 152*a* to 152*g* are provided at the upper end of the outer surface SO. The recesses 152*a* to 152*g* are recessed backward from the front main surface SF3 of the plate-shaped portion 140. This prevents the solder from wetting upward too much. The overall structure of the metal member 14*k* is the same as the overall structure of any one of the metal members 14, and 14*a* to 14*i*.

According to the metal member 14*k*, the self-alignment property of the foot portions 146*a* to 146*g* is improved. More specifically, in the metal member 14*k*, the solders 200*a* to 200*g* are hardly wetted upward on the outer surface SO and the back end portions of the foot portions 146*a* to 146*g*. In this case, the foot portions 146*a* to 146*g* are fixed to the mounting electrode 122 only on the lower surfaces Sx of the foot portions 146*a* to 146*g* by the solders 200*a* to 200*g*. In this case, the self-alignment property of the foot portions 146*a* to 146*g* is improved.

(Twelfth Modification)

Hereinafter, a metal member 141 according to a twelfth modification will be described with reference to the drawings. FIG. 24 is a cross-sectional view at the center in the left-right direction of a top surface portion 148 of a metal member 141 according to a twelfth modification. FIG. 25 is a top view of the metal member 141 according to the twelfth modification.

The top surface portion 148 is formed by bending a part of the metal member 141 in the rear direction. At this time, the thickness of the portion where the metal member 141 is bent is thinner than the thickness of the plate-shaped portion 140. This facilitates grinding of the top surface portion 148. When the thickness of the portion where the metal member 141 is bent is reduced, the top surface portion 148 is easily displaced with respect to the plate-shaped portion 140. Therefore, when the metal member 141 is mounted on the substrate 12, the impact transmitted from the substrate 12 to the metal member 141 is absorbed by the top surface portion 148.

The thickness of the portion where the metal member 141 is bent is thinner than the thickness of the plate-shaped portion 140. In other words, the thickness of the plate-shaped portion 140 is increased by the amount by which the thickness of the portion where the metal member 141 is bent is reduced. Therefore, as illustrated in FIG. 25, the molten resin flowing to the front main surface SF3 of the plate-shaped portion 140 flows in the left direction or the right direction. That is, the molten resin flows toward the left end and the right end of the plate-shaped portion 140.

(Thirteenth Modification)

Figure 26:
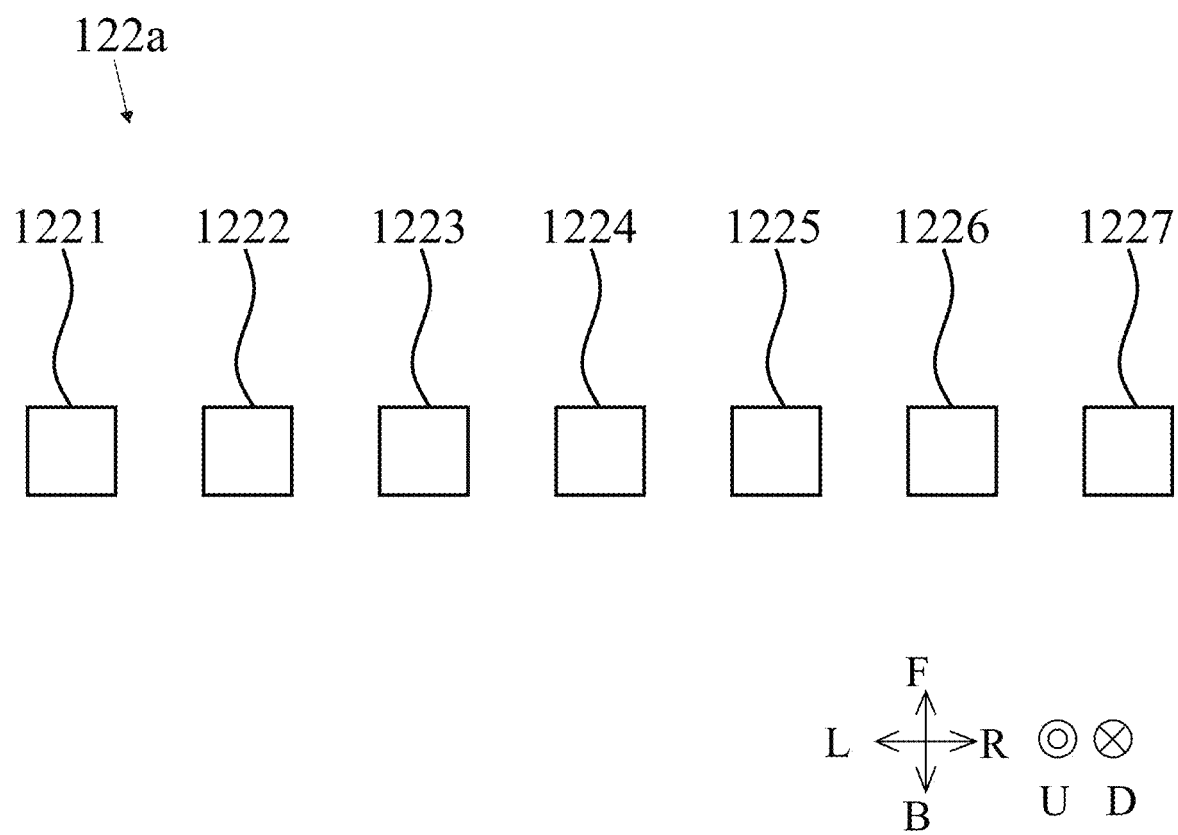

Hereinafter, a mounting electrode 122*a* according to a thirteenth modification will be described with reference to the drawings. FIG. 26 is a top view of a mounting electrode 122*a*.

The mounting electrode 122*a* is different from the mounting electrode 122 in including seven small electrodes 1221 to 1227. Each of the foot portions 146*a* to 146*g* of the metal member 14 is fixed to the small electrodes 1221 to 1227 with the solders 200*a* to 200*g*. However, some of the foot portions 146*a* to 146*g* may be fixed to some of the small electrodes 1221 to 1227 by the solders 200*a* to 200*g*. As described above, since the mounting electrode 122*a* is divided into the seven small electrodes 1221 to 1227, the self-alignment property of the foot portions 146*a* to 146*g* is improved.

Further, since the mounting electrode 122*a* is divided into seven small electrodes 1221 to 1227, the solders 200*a* to 200*g* do not exist between the small electrodes 1221 to 1227. Therefore, according to the mounting electrode 122*a*, the solders 200*a* to 200*g* for fixing the metal member 14 may be reduced. In addition, since the area of the mounting electrode 122*a* is reduced, the degree of freedom in designing the substrate 12 is increased. In addition, in a case where there is an unnecessary small electrode in the small electrodes 1221 to 1227, the unnecessary small electrode may be removed. In this case, it is possible to dispose the electronic component near the region from which the unnecessary small electrode is removed. That is, the degree of freedom in arrangement of the electronic components is increased. The number of small electrodes is not limited to seven. The number of small electrodes may be plural.

(Fourteenth Modification)

Hereinafter, a mounting electrode 122*b* according to a fourteenth modification will be described with reference to the drawings. FIG. 27 is a top view of a mounting electrode 122*b*.

The mounting electrode 122*b* is different from the mounting electrode 122 in the shape of the rear side. The mounting electrode 122 has a rectangular shape when viewed in the up-down direction. Therefore, the rear side of the mounting electrode 122 is a straight line. On the other hand, the rear side of the mounting electrode 122*b* has a zigzag shape. Thus, the mounting electrode 122*b* has the same shape as the metal member 14 when viewed in the up-down direction. Therefore, the lower end of the plate-shaped portion 140 of the metal member and the foot portions 146*a* to 146*g* are fixed to the mounting electrode 122*b* by the solders 200*a* to 200*g*. In addition, since the area of the mounting electrode 122*b* is large, the solders 200*a* to 200*g* on the mounting electrode 122*b* are located on the front, back, left, and right of the foot portions 146*a* to 146*g*. Thus, the solders 200*a* to 200*g* are easily wetted upward on the side surfaces of the foot portions 146*a* to 146*g*.

(Fifteenth Modification)

Figure 28:
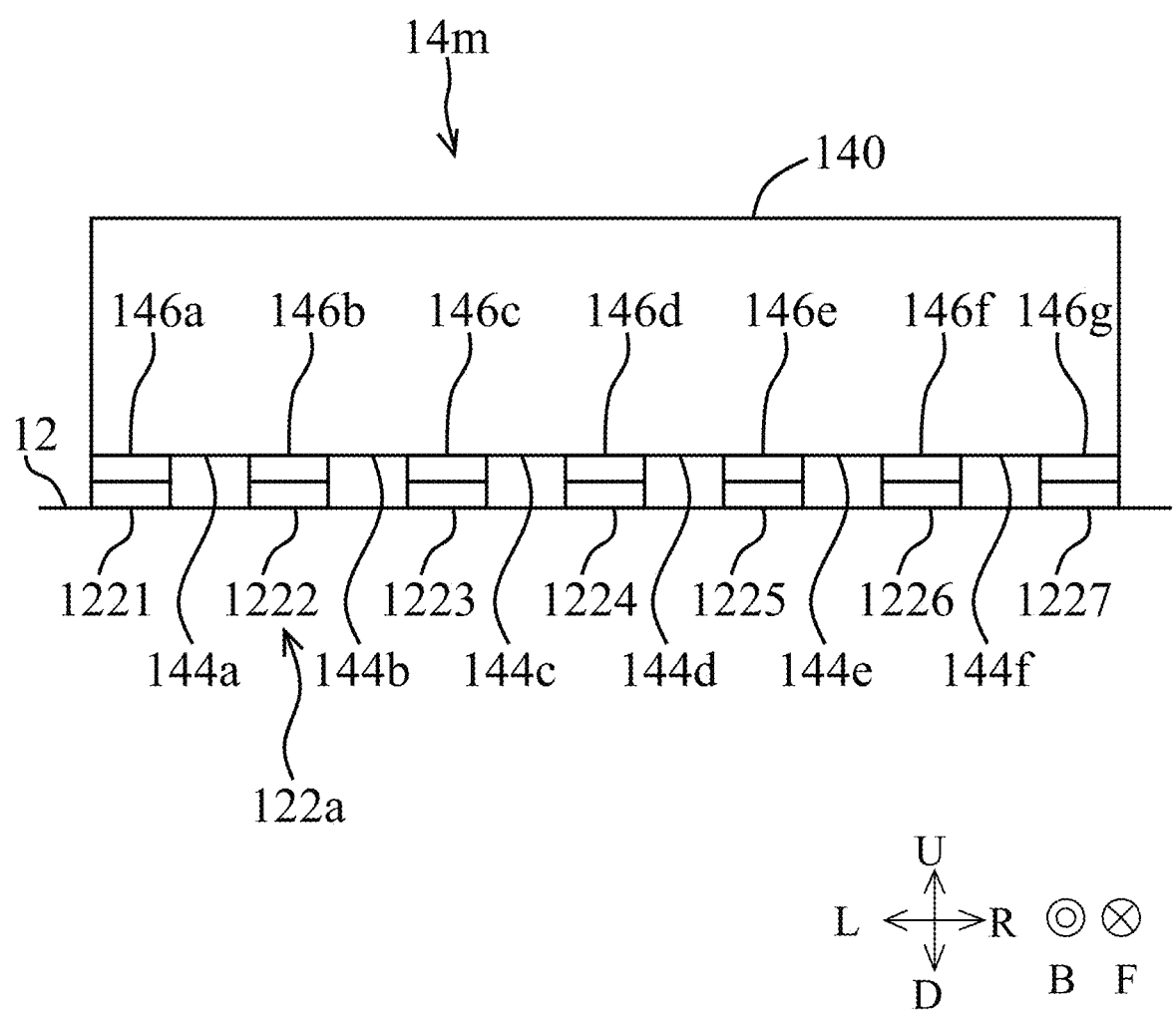

Hereinafter, a metal member 14*m* according to a fifteenth modification will be described with reference to the drawings. FIG. 28 is a rear view of a metal member 14*m* and a mounting electrode 122*a*.

The metal member 14*m* is different from the metal member 14 in the length of the lower notches 144*a* to 144*f* in the up-down direction. More specifically, in the metal member 14*m*, the lengths of the lower notches 144*a* to 144*f* in the up-down direction are about the thicknesses of the foot portions 146*a* to 146*g*. In this manner, the lower notches 144*a* to 144*f* may be formed using the thicknesses of the foot portions 146*a* to 146*g*. In this case, each of the foot portions 146*a* to 146*g* is fixed to the small electrodes 1221 to 1227 of the mounting electrode 122*a* by the solders 200*a* to 200*g*. When the thickness of the small electrodes 1221 to 1227 of the mounting electrode 122*a* increases, it can be considered that the lengths of the lower notches 144*a* to 144*f* in the up-down direction are enlarged. As a result, the sealing resin layer 18 is easily formed.

(Modification of Module 10)

Figure 29:
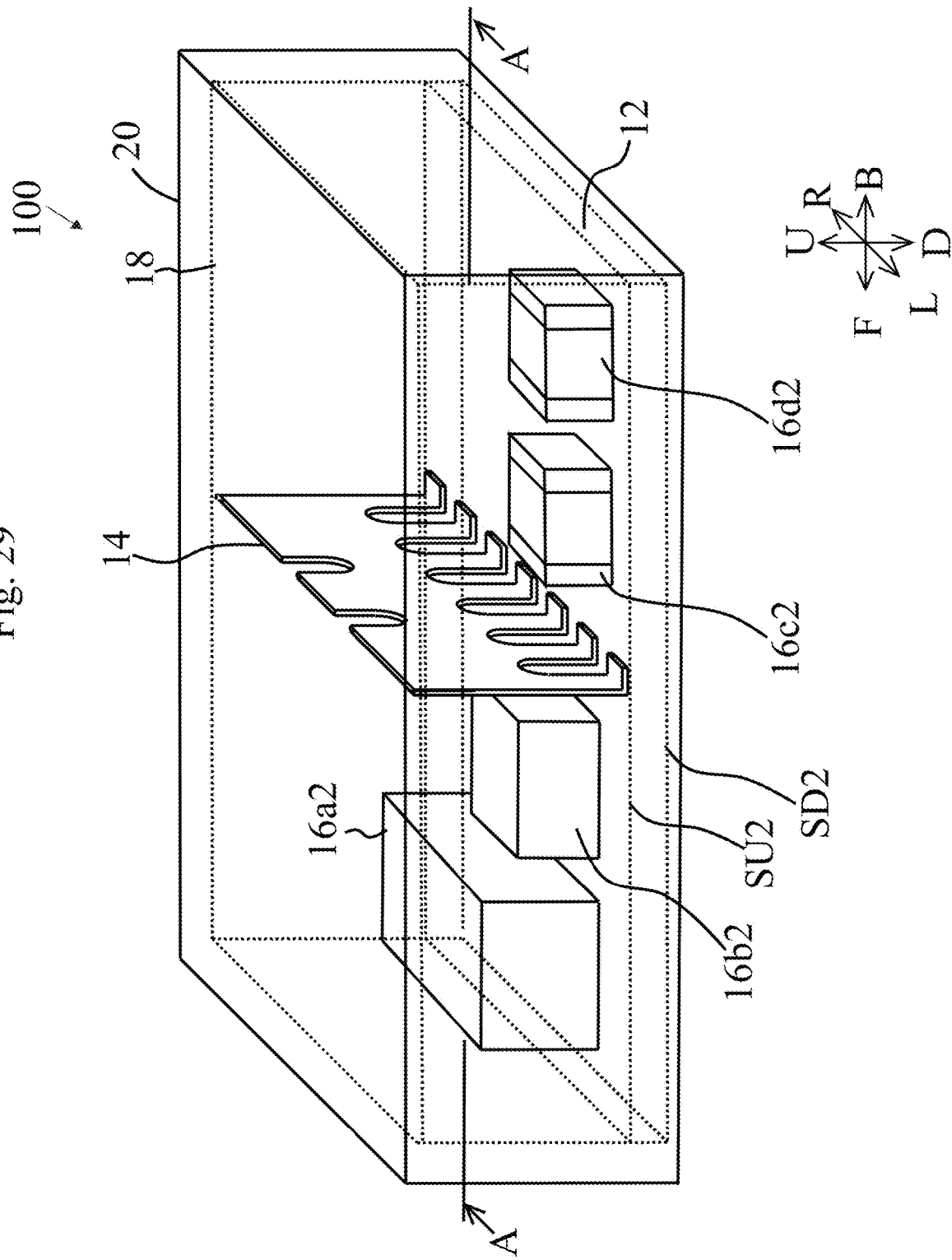
FIG. 29 is an external perspective view of the module 100.
Figure 31:
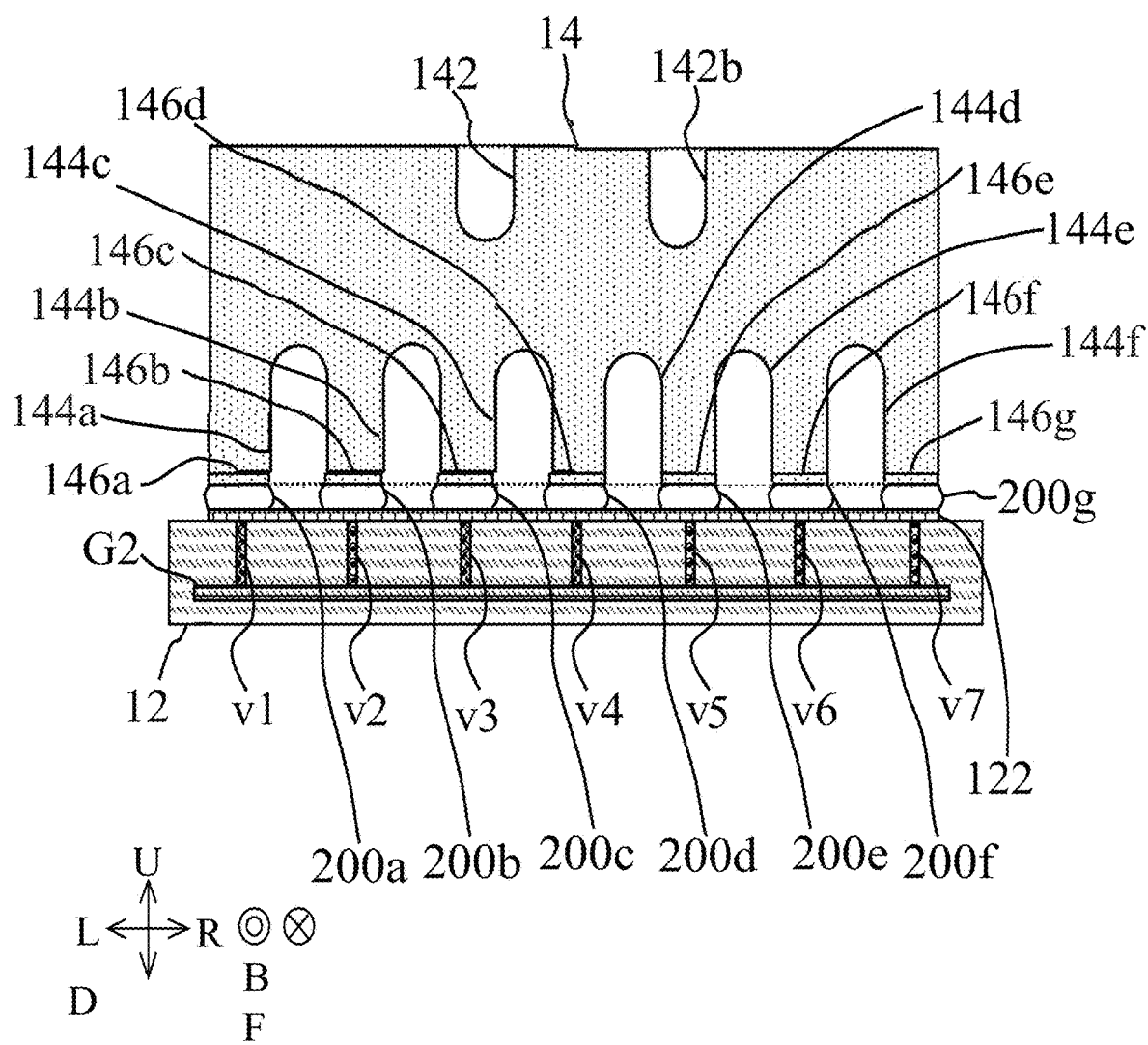
FIG. 31 is a view of the metal member 14 connected to a ground conductor layer G2 via a mounting electrode 122 in the module 100.

Hereinafter, a module 100 according to a modification of the module 10 will be described with reference to the drawings. FIG. 29 is an external perspective view of the module 100. FIG. 30 is a cross-sectional view of the module 100 taken along line A-A. FIG. 31 is a view of the metal member 14 connected to the ground conductor layer G2 via the mounting electrode 122. In the module 100, the same components as those of the module 10 illustrated in FIG. 1 are denoted by the same reference numerals, and description thereof is omitted.

The module 100 differs from module 10 in that the arrangement of electronic components is different. Specifically, as illustrated in FIG. 29, the module 100 includes four electronic components (electronic components 16*a*2 to 16*d*2). As illustrated in FIG. 30, the electronic components 16*a*2 to 16*d*2 are arranged in the front-back direction. As illustrated in FIGS. 29 and 30, the electronic components 16*a*2 and 16*b*2 are located in front of the metal member 14. The electronic component 16*a*2 and the electronic component 16*b*2 are electrically connected to each other. Specifically, as illustrated in FIG. 30, the electronic component 16*a*2 is connected to a signal conductor layer SC1 through a via v11. The electronic component 16b2 is connected to the signal conductor layer SC1 through a via v12. As described above, the electronic component 16a2 and the electronic component 16b2 are electrically connected via the signal conductor layer SC1.

As illustrated in FIGS. 29 and 30, electronic components 16c2 and 16d2 are located behind the metal member 14. The electronic component 16c2 and the electronic component 16d2 are electrically connected to each other. Specifically, as illustrated in FIG. 30, the electronic component 16c2 is connected to a signal conductor layer SC2 through a via v21. The electronic component 16b2 is connected to the signal conductor layer SC2 through a via v22. As described above, the electronic component 16c2 and the electronic component 16d2 are electrically connected via the signal conductor layer SC2.

In the module 100, the metal member 14 is connected to the ground conductor layer G2 via the mounting electrode 122 as illustrated in FIGS. 30 and 31. More specifically, as illustrated in FIG. 31, the respective foot portions 146a to 146g of the metal member 14 are fixed to the mounting electrode 122 by the solders 200a to 200g. The mounting electrode 122 is electrically connected to the ground conductor layer G2 by vias v1 to v7. The vias v1 to v7 are provided in the substrate 12. As described above, the metal member 14 is connected to the ground conductor layer G2 via the solders 200a to 200g, the mounting electrode 122, and the vias v1 to v7.

As illustrated in FIG. 31, the vias v1 to v7 are provided at equal intervals in the left-right direction. The interval between the adjacent vias v1 to v7 is, for example, ½ or ¼ of the wavelength of a signal transmitted through a signal conductor layer (not illustrated) of the substrate 12. Further, the vias v1 to v7 are connected to the ground conductor layer G2. In this case, the vias v1 to v7 can shield a signal propagating in the substrate 12. Specifically, in a case where the vias v1 to v7 are installed at an interval of ½ or ¼ of the wavelength of the signal, the vias v1 to v7 are located in a portion to be a node in a composite wave (that is, a stationary wave) of the incident wave of the signal and the reflected wave of the signal. Thus, a stationary wave with respect to the input signal is less likely to be generated in the substrate 12. As a result, signals propagating in the substrate 12 can be shielded by the vias v1 to v7.

Hereinafter, the shielding property of the metal member 14 provided with the vias v1 to v7 will be described in detail. In the module 100, for example, as illustrated in FIG. 30, there is a possibility that an interference wave IW1 is generated from the signal conductor layer SC1. At this time, as illustrated in FIG. 30, there is a possibility that the interference wave IW1 generated from the signal conductor layer SC1 travels backward.

When the vias v1 to v7 are not provided under the metal member 14, there is a possibility that the interference wave IW1 passes under the metal member 14.

On the other hand, when the vias v1 to v7 are provided under the metal member 14, the interference wave IW1 is shielded by the vias v1 to v7 as illustrated in FIG. 30. Therefore, there is a low possibility that the interference wave IW1 passes under the metal member 14.

Similarly, as illustrated in FIG. 30, there is a possibility that an interference wave IW2 is generated from the signal conductor layer SC2. At this time, as illustrated in FIG. 30, in a case where vias v1 to v7 are provided under the metal member 14, the interference wave IW2 is shielded by the vias v1 to v7. Therefore, there is a low possibility that the interference wave IW2 passes under the metal member 14.

The vias included in the module 100 are not limited to the vias v1 to v7, and can be changed within the scope of the gist. Specifically, the structure of the via may be changed according to the shape of the metal member 14 and the shape of the mounting electrode 122. For example, distances between ground contact surfaces (surfaces in contact with the solders 200a to 200g) of the foot portions 146a to 146g and the vias v1 to v7 may be reduced. Thus, the distance between the ground conductor layer G2 and the ground plane in the foot portions 146a to 146g is shortened. In this case, the characteristic impedance of the module 100 decreases. Therefore, the noise generated in the module 100 is easily guided to the ground conductor layer G2. The method of making the distances between the ground contact surfaces of the foot portions 146a to 146g and the vias v1 to v7 close to each other is, for example, a method of reducing the thicknesses of the solders 200a to 200g.

The number of vias included in the module 100 is not limited to 7.

The vias v1 to v7 are not necessarily arranged at equal intervals.

(Sixteenth Modification)

Figure 32:
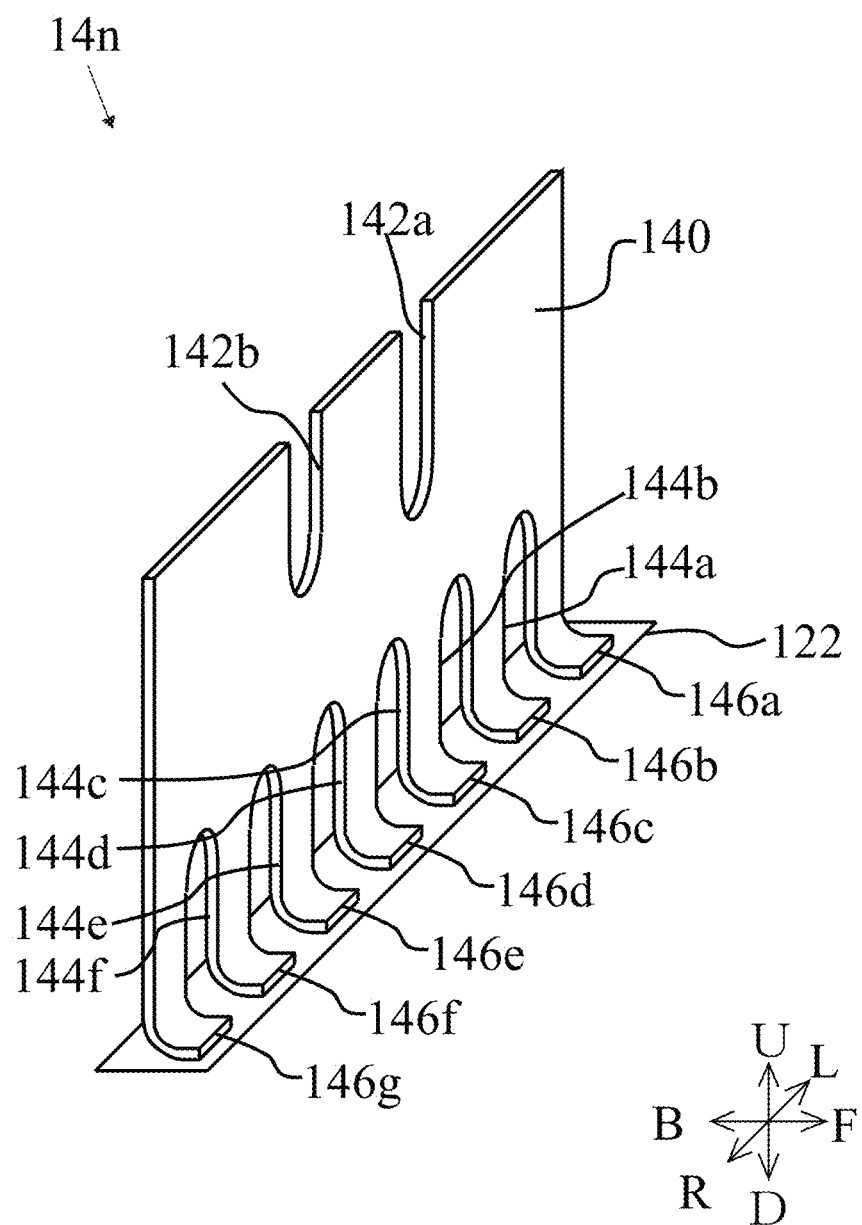
FIG. 32 is a perspective view of a metal member 14n.

Hereinafter, a metal member 14n according to a sixteenth modification will be described with reference to the drawings. FIG. 32 is a perspective view of a metal member 14n.

The metal member 14n is different from the metal member 14 in that the foot portions 146a to 146g extend forward from the lower side LD of the plate-shaped portion 140. Since other structures of the metal member 14n are the same as those of the metal member 14, the description thereof will be omitted.

(Seventeenth Modification)

Hereinafter, a metal member 14o according to a seventeenth modification will be described with reference to the drawings. FIG. 33 is a top view of a metal member 14o.

The metal member 14o is different from the metal member 14 in that the foot portions 146a, 146c, 146e, and 146g extend backward from the lower side LD of the plate-shaped portion 140, and the foot portions 146b, 146d, and 146f extend forward from the lower side LD of the plate-shaped portion 140. Since other structures of the metal member 14n are the same as those of the metal member 14, the description thereof will be omitted.

(Eighteenth Modification)

Hereinafter, a module 10 according to an eighteenth modification will be described with reference to the drawings. FIG. 34 is a cross-sectional view of a module 10 according to an eighteenth modification.

In the module 10 according to the eighteenth modification, the metal member 14 is not inclined in the front-back direction. That is, the normal vector of the front main surface SF3 of the plate-shaped portion 140 is parallel to the front-back direction. The normal vector of the back main surface SB3 of the plate-shaped portion 140 is parallel to the front-back direction.

Other Embodiments

The module according to the present disclosure is not limited to the module 10 according to the above embodiment, and can be changed within the scope of the gist of the present disclosure.

The structures of the metal members 14 and 14a to 14o and the structures of the mounting electrodes 122, 122a, and 122b may be arbitrarily combined with the module 10.

The plate-shaped portion 140 may be inclined with respect to the up-down direction such that the upper end of the plate-shaped portion 140 is located behind the lower end of the plate-shaped portion 140. In this case, all of the one or more foot portions may extend forward from the lower side LD and may be inclined with respect to the front-back direction such that the front end of the foot portion is located above the back end of the foot portion.

The substrate 12 may have a shape other than a rectangular shape when viewed in the up-down direction.

The number of electronic components 16a to 16c is not limited to 3.

The plate-shaped portion 140 may be provided with one or more upper notches and one or more lower notches.

The metal members 14 and 14a to 14n may include at least one or more foot portions. The metal member 14o may include two or more foot portions.

All of the plurality of foot portions extend backward from the lower side LD of the plate-shaped portion 140 by bending the metal member 14 at the lower side LD of the plate-shaped portion 140. However, all of the plurality of foot portions may extend forward from the lower side of the plate-shaped portion 140 by bending the metal member 14 at the lower side LD of the plate-shaped portion 140. In this case, the outer surface SO of the portion where the metal member 14 is bent is located on the second main surface S2. The outer surface SO of the portion where the metal member 14 is bent is connected to the back main surface SB3. The surface roughness of the outer surface SO of the portion where the metal member 14 is bent is smaller than the surface roughness of the back main surface SB3.

A part of the plurality of foot portions may extend backward from the lower side of the plate-shaped portion 140, and the rest of the plurality of foot portions may extend forward from the lower side of the plate-shaped portion 140.

The plurality of lines may extend in the up-down direction. That is, the predetermined direction may be the up-down direction. Also in this case, when the metal member 14 is bent to form the foot portions 146a to 146g, the plurality of lines formed on the outer surface SO of the metal member 14 are extended in the direction in which the lines extend. Therefore, the depth of the plurality of lines formed on the outer surface SO of the metal member 14 becomes shallow. As a result, the surface roughness of the outer surface SO of the portion where the metal member 14 is bent is smaller than the surface roughness of the portion excluding the outer surface SO of the first main surface S1 of the metal member 14. The plurality of lines may extend in a direction other than the up-down direction and the left-right direction. That is, the predetermined direction may be a direction other than the up-down direction and the left-right direction.

The shortest distance between the upper notch and the lower notch may be shorter than 1.5 times the plate thickness of the plate-shaped portion.

The left end of the plate-shaped portion 140 may not be located on the left surface SL1 of the sealing resin layer 18. The right end of the plate-shaped portion 140 may not be located on the right surface SR1 of the sealing resin layer 18. The upper end of the plate-shaped portion 140 may not be located on the upper surface SU1 of the sealing resin layer 18. In addition, since the upper end of the plate-shaped portion 140 is located on the upper surface SU1 of the sealing resin layer 18, the upper end of the plate-shaped portion 140 may be electrically connected to the shield 20, the left end of the plate-shaped portion 140 may not be located on the left surface SL1 of the sealing resin layer 18, and the right end of the plate-shaped portion 140 may not be located on the right surface SR1 of the sealing resin layer 18.

The module 10 may not include the shield 20.

The shield 20 may cover at least the upper surface SU1 of the sealing resin layer 18. Therefore, the shield 20 may not cover a part or all of the left surface SL1, the right surface SR1, the front surface SF1, and the back surface SB1 of the sealing resin layer 18, for example.

Incidentally, the outer edge of the substrate 12 may not overlap so as to coincide with the outer edge of the sealing resin layer 18 when viewed in the up-down direction. That is, the front surface SF1 of the sealing resin layer 18 may be located in front of the front surface SF2 of the substrate 12. The back surface SB1 of the sealing resin layer 18 may be located behind the back surface SB2 of the substrate 12. The left surface SL1 of the sealing resin layer 18 may be located to the left of the left surface SL2 of the substrate 12. The right surface SR1 of the sealing resin layer 18 may be located to the right of the right surface SR2 of the substrate 12.

The electronic components 16a to 16c do not protrude leftward or rightward from the metal member 14 when viewed in the front-back direction. However, a part of the electronic components 16a to 16c may protrude leftward or rightward from the metal member 14 when viewed in the front-back direction.

The area of the top surface portion 148 may be larger than the area of each of the foot portions 146a to 146g. Thus, the metal member 14 can be easily adsorbed by the mounting machine. In addition, the center of gravity of the metal member 14 is located above and in front of the metal member. Thus, the metal member 14 is slightly inclined forward. The foot portions 146a to 146g support the inclination of the metal member 14. Thus, the foot portions 146a to 146g slightly sink into the solders 200a to 200g. As a result, the solders 200a to 200g more reliably adhere to the foot portions 146a to 146g. Thus, the metal member 14 is more reliably fixed to the mounting electrode 122. Further, in the metal member 14 including the top surface portion 148, the distance in the up-down direction from the lower end of the metal member 14 to the center of gravity of the metal member 14 is, for example, ⅘ or less of the height in the up-down direction of the metal member 14. Thus, self-standing of the metal member 14 is improved.

Further, in the metal member 14 including the top surface portion 148, the position of the center of gravity of the metal member 14 in the front-back direction is behind the plate-shaped portion 140 and in front of the back ends of the foot portions 146a to 146g. Thus, even if the plate-shaped portion 140 is slightly inclined forward, the center of gravity of the metal member 14 is located near the center of the metal member 14 in the front-back direction. As a result, self-standing of the metal member 14 is improved.

For example, when viewed in the up-down direction, the top surface portion 148 does not overlap with the electronic component 16c having the highest height in the up-down direction among the electronic components 16a to 16c.

The top surface portion 148 is formed by bending a part of the metal member 14 backward. Therefore, the top surface portion 148 extends from the plate-shaped portion 140 in the same direction as the foot portions 146a to 146g. However, the top surface portion 148 may be formed by bending a part of the metal member 14 forward. That is, the top surface portion 148 may extend from the plate-shaped portion 140 in the direction opposite to the direction in which the foot portions 146a to 146g extend from the plate-shaped portion 140. However, from the viewpoint of increasing the area where the electronic components 16a to 16c can be mounted on the upper main surface SU2 of the substrate 12, the top surface portion 148 may extend from the plate-shaped portion 140 in the same direction as the direction in which the foot portions 146a to 146g extend from the plate-shaped portion. In addition, when the top surface portion 148 and the foot portions 146a to 146g extend from the plate-shaped portion 140 in the same direction, the foot portions 146a to 146g and the top surface portion 148 can be simultaneously formed. In this case, since the number of times of bending of the metal member 14 is 1, the foot portions 146a to 146g and the top surface portion 148 can be accurately formed. In addition, since the number of times of bending of the metal member 14 is 1, the manufacturing cost of the metal member 14 is reduced.

In the module 10, as illustrated in FIG. 6, the solders 200a to 200g wet upward on the outer surface SO, and the solders 200a to 200g are not wetted upward on the back end portions of the foot portions 146a to 146g. However, the solders 200a to 200g may not be wetted upward on the outer surface SO.

The protruding portion 160 may extend forward from the upper end of the plate-shaped portion 140.

Solder is used to fix the foot portions 146a to 146g to the mounting electrodes 122, 122a, and 122b. However, instead of the solder, for example, a resin adhesive containing a metal filler such as Cu or Ag may be used. That is, a conductive member such as solder or a resin adhesive may be used to fix the foot portions 146a to 146g to the mounting electrodes 122, 122a, and 122b.

The first main surface S1 and the second main surface S2 of the metal plate 114 may do not necessarily have a plurality of lines (streaks) extending in the left-right direction (not illustrated). For example, a plurality of lines (streaks) extending in the up-down direction (not illustrated) may be formed on the first main surface S1 and the second main surface S2 of the metal plate 114. In this case, the predetermined direction is the up-down direction.

On the first main surface S1 and the second main surface S2 of the metal plate 114, for example, a plurality of lines (not illustrated) extending in the up-down direction and extending in the left-right direction may be formed. In other words, the predetermined direction may include a vertical vector component and a horizontal vector component. In this case, the predetermined direction does not coincide with the up-down direction. Similarly, the predetermined direction and the left-right direction do not coincide with each other.

10 module
12 substrate
14, 14a to 14o metal member
16a to 16c electronic component
18 sealing resin layer
20 shield
114 metal plate
122, 122a, 122b mounting electrode
140 plate-shaped portion
142a to 142d upper notch
144a to 144f, 144x to 144z lower notch
146a to 146g foot portion
148 top surface portion
150a to 150g protrusion
152a to 152g recess
160 protruding portion
200a to 200g solder
1221 to 1227 small electrode
C boundary
G ground conductor layer
LD lower side
LU upper side
S1 first main surface
S2 second main surface
SI inner surface
SO outer surface
Sa virtual plane

The invention claimed is:

1. A module comprising:
a substrate having an upper main surface and a lower main surface arranged in an up-down direction;
a metal member provided on the upper main surface of the substrate;
a first electronic component and a second electronic component mounted on the upper main surface of the substrate; and
a sealing resin layer provided on the upper main surface of the substrate and covering the metal member, the first electronic component, and the second electronic component, wherein
the metal member includes a plate-shaped portion and one or more foot portions,
the metal member is a rolled material,
the plate-shaped portion has a front main surface and a back main surface arranged in a front-back direction when viewed in the up-down direction,
the first electronic component is disposed in front of the metal member,
the second electronic component is disposed behind the metal member,
when viewed in the front-back direction, a line connecting a lower end of the plate-shaped portion in a left-right direction is defined as a lower side,
the one or more foot portions extend forward or backward from the lower side by bending the metal member at the lower side of the plate-shaped portion,
a plurality of rolling flaws extending in a predetermined direction are provided on the front main surface, the back main surface, an outer surface of a portion where the metal member is bent, and an inner surface of the portion where the metal member is bent, and
the outer surface of the portion where the metal member is bent is connected to the front main surface, and
surface roughness of the outer surface of the portion where the metal member is bent is smaller than surface roughness of the front main surface.

2. The module according to claim 1, wherein
a crack is formed on the outer surface of the portion where the metal member is bent.

3. The module according to claim 1, wherein
the predetermined direction is the left-right direction.

4. The module according to claim 1, wherein
the predetermined direction is the up-down direction.

5. The module according to claim 1, wherein
the one or more foot portions include a plurality of foot portions, and
all of the plurality of foot portions extend forward from the lower side, or all of the plurality of foot portions extend backward from the lower side.

6. The module according to claim 1, wherein
the one or more foot portions include a plurality of foot portions,
the substrate includes a mounting electrode being a part of the upper main surface of the substrate, and
the plurality of foot portions are fixed to the mounting electrode by a conductive member.

7. The module according to claim 6, wherein
the mounting electrode includes a plurality of small electrodes, and
each of the plurality of foot portions is fixed to the plurality of small electrodes by a conductive member.

8. The module according to claim 6, wherein
the mounting electrode is one electrode, and
the plurality of foot portions are fixed to the mounting electrode which is one electrode by an integrated conductive member.

9. The module according to claim 1, wherein
a left end of the plate-shaped portion is located on a left surface of the sealing resin layer,
a right end of the plate-shaped portion is located on a right surface of the sealing resin layer, and
an upper end of the plate-shaped portion is located on an upper surface of the sealing resin layer.

10. The module according to claim 2, wherein the predetermined direction is the left-right direction.

11. The module according to claim 2, wherein the predetermined direction is the up-down direction.

* * * * *